(12) United States Patent
Hynecek

(10) Patent No.: US 6,278,142 B1
(45) Date of Patent: Aug. 21, 2001

(54) SEMICONDUCTOR IMAGE INTENSIFIER

(75) Inventor: Jaroslav Hynecek, Richardson, TX (US)

(73) Assignee: Isetex, Inc, Allen, TX (US)

( * ) Notice: Subject to any disclaimer, the term of this patent is extended or adjusted under 35 U.S.C. 154(b) by 0 days.

(21) Appl. No.: 09/489,347

(22) Filed: Jan. 21, 2000

Related U.S. Application Data

(60) Provisional application No. 60/151,370, filed on Aug. 30, 1999.

(51) Int. Cl.[7] .......................... H01L 27/148; H01L 29/768
(52) U.S. Cl. .......................... 257/247; 247/243; 247/249; 247/250
(58) Field of Search .................................. 257/231, 232, 257/243, 247, 249, 250

(56) References Cited

U.S. PATENT DOCUMENTS 5,286,990 * 2/1994 Hynecek ................. 257/247
5,453,632 * 9/1995 Hynecek et al. ......... 257/247

* cited by examiner

*Primary Examiner*—Ngân V. Ngô
(74) *Attorney, Agent, or Firm*—John E. Vandigriff

(57) ABSTRACT

A charge carrier multiplier is disclosed in which a carrier that passes through a high-field region lying entirely within the depleted semiconductor volume causes a single-step impact ionization without avalanching. By spacing the high-field region sufficiently away from any substrate region that is not depleted of carriers of opposite polarity than the ionizing carrier, generation of unwanted spurious charge is minimized. Preferably the cell includes a depleted channel formed in a substrate, a gate structure insulatively disposed over and transverse to the channel having an aperture formed therein, and a charge multiplication gate electrode insulatively disposed over the aperture. In one embodiment, the gate electrode structure includes a first aperture gate electrode having the aperture formed therethrough, and in another embodiment, the gate electrode structure includes first and second aperture gate electrodes having respective first and second reticulations therein so as to frame the aperture.

34 Claims, 15 Drawing Sheets

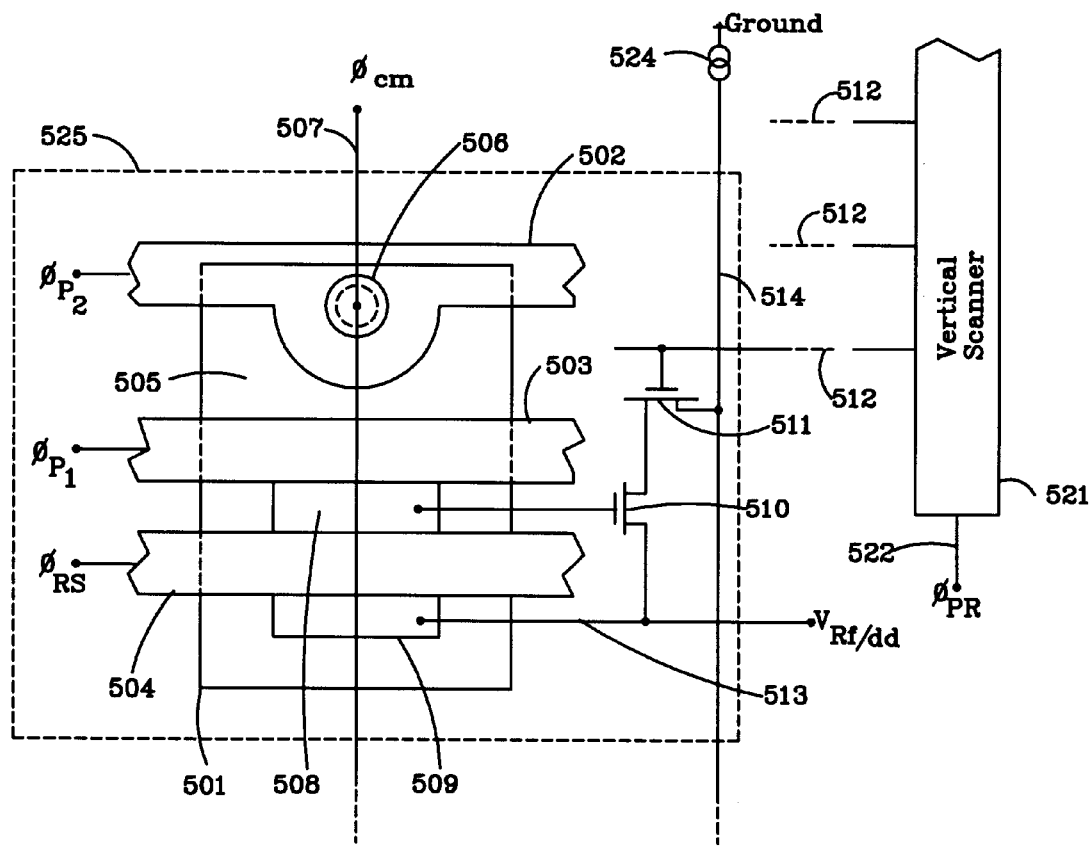
FIG. 13
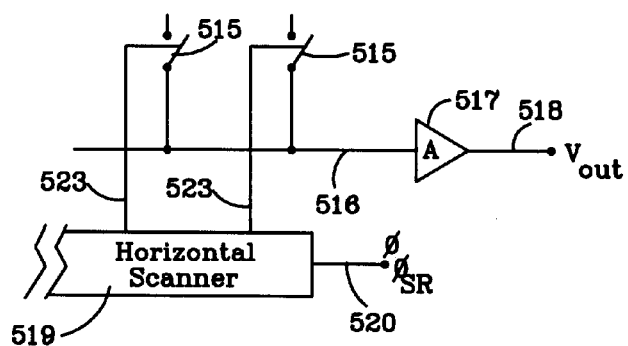

SEMICONDUCTOR IMAGE INTENSIFIER

CROSS-REFERENCE TO OTHER APPLICATION

This application claims priority from U.S. provisional application No. 60/151,370 filed Aug. 30, 1999, which is hereby incorporated by reference.

BACKGROUND AND SUMMARY OF THE INVENTION

The present application relates to solid-state image intensifiers, specifically to an image intensifier fabricated in a monolithic form on a single piece of a semiconductor substrate using standard semiconductor Integrated Circuit (IC) manufacturing methods. In particular, the invention relates to solid-state image sensor/intensifiers which exploit charge multiplication by single carrier impact ionization.

An Image Intensifier (or "II") is an image-sensing device that has the ability to convert an image, formed by only a few or a single photon per pixel, to many electrons per pixel without adding any appreciable noise. This is advantageous in many low-light-level imaging applications, since the image signal formed by many electrons per pixel is easier to detect and process. The signal, consisting of many electrons instead of only one, can always be kept above the charge detector and system noise floor.

Traditionally, image-intensifying detectors have used vacuum tube devices. In such devices an image is projected onto a suitable photo-cathode, and the liberated photoelectrons are multiplied on their way to the anode. The multiplication method typically used is based on a micro-channel concept where electrons are multiplied several hundred or a thousand times before they are sensed. The resulting multiplied image charge is then either scanned or directly displayed on a suitable anode viewing screen. Such devices are used today in military night vision scopes and other low-light-level image sensing cameras. While these devices achieve a superb performance and have many desirable characteristics such as low power consumption and a very high sensitivity, they also have undesirable characteristics that are not easily overcome. The vacuum tube technology does not lend itself to low cost-high volume production, significant miniaturization, color sensing, and an easy interface with today's modern digital image processing systems. The vacuum tube intensifiers also require high voltages for their operation. For these and other reasons described herein, the current research efforts have focussed on developing image intensifier devices that can be fabricated using standard semiconductor manufacturing technology.

An example of such work, using a hybrid approach, is found in T. Watabe et al., "CMOS Image Sensor Overlaid with HARP Photoconversion Layer", PROCEEDINGS OF 1999 IEEE WORKSHOP ON CHARGE-COUPLED DEVICES AND ADVANCED IMAGE SENSORS (Jun. 10–12, 1999, Karuizawa, Nagano, Japan), paper R33, which is hereby incorporated by reference.

Another example of the image intensifier concept, implemented monolithically and directly in a solid state semiconductor substrate, is described in U.S. Pat. No. 5,337,340 to Hynecek (1994), which is also hereby incorporated by reference.

U.S. Pat. No. 4,912,536 to Lou describes yet another non-imaging device that represents an accumulation and multiplication photodetector having three adjacent MOS gates formed on a suitable substrate. The first gate is biased such that a depletion well is formed underneath that accumulates photocharge. The second gate is a transfer gate that isolates the accumulation well from the avalanche well formed under the third, avalanche, gate. After the third gate is biased into the avalanche-ready condition, the second gate is opened and accumulated charge from the accumulation well is transferred into the avalanche well. During the charge transfer process charge undergoes amplification by a multiplication factor associated with the avalanche process.

Known monolithic image sensors, such as CCD or CMOS based devices, have achieved high performance in resolution, sensitivity, noise, and miniaturization. Camcorders and popular Digital Still Cameras (DSC), that employ these sensors and are successfully competing with film, would not be possible without them. However, the reduction in chip size needed for cost competitiveness requires a reduction in pixel size. Unfortunately, as the pixel size is reduced, there is an associated and unavoidable reduction in sensitivity that leads to a reduction in S/N ratio. The reduction in S/N ratio is due to the fixed charge detector noise floor that is not easily reduced. It seems difficult to reduce the noise floor of the on-chip charge detectors to a single electron or below. Therefore, the charge multiplication concept, as described in U.S. Pat. No. 5,337,340, holds out the promise of achieving a competitive performance advantage within the image intensifier technologies since charge multiplication can improve sensitivity without an appreciable increase in noise.

U.S. Pat. No. 5,337,340 teaches the basic concept of carrier multiplication in a semiconductor and its application to CCD image-sensing devices. When a photon is received in a pixel and converted into an electron, the resulting electron can be transferred in a CCD fashion through a high field region to cause impact ionization. Impact ionization generates a new electron-hole pair and thus increases the original number of electrons. Typically no more than one new electron-hole pair is created per electron transfer, and avalanche multiplication is never allowed to begin. This is one of the features that distinguishes the concept described in U.S. Pat. No. 5,337,340 from the concept described in U.S. Pat. No. 4,912,536. It can be shown theoretically that the impact ionization process is relatively noise free, so the photon generated charge signal can be increased above the system noise floor without reducing the Signal to Noise ratio (S/N). By contrast, avalanching is a noisy process (in which impact ionization generates secondary carriers which themselves generate further secondary carriers).

While the general concept described in the U.S. Pat. No. 5,337,340 is sound, some more recent experimentation has provided some new data on the noise floor of this approach. See Hynecek, "CCM-A New Low-Noise Charge Carrier Multiplier Suitable for Detection of Charge in Small Pixel CCD Image Sensors", 39 IEEE TRANSACTIONS ON ELECTRON DEVICES 1972 (1992). A Single Photon Detection (SPD) by monolithic Solid State Image Sensors thus remains a desirable goal.

FIGS. 1 and 2 show a plan view and a cross section of a CCD unit cell 101 used in typical CCD image sensors before the final dielectric layer overcoat and the metal patterning steps have been applied to the structure. In FIG. 1, channel stop regions 104 and 106 confine charge in the Y direction while gate electrodes 102 and 103 together with the Virtual Electrode (VE) region 105 confine charge in the X direction. The CCD channel is defined between the channel stops 104 and 106. The electrical interconnect lines that apply clock signals f1 and f2 to the physical structures are shown symbolically. By applying suitable biases to gate electrodes 102 and 103, charge can be transferred up or down the CCD channel. The potential profile for various gate biases in regions 107 and 108 and the resulting charge transfer process is shown in FIG. 2. Potentials in regions 107 and 108 change from level 150 to 152 while the potential of the VE region 105 stays constant at fixed level 151. For completeness, the cross section of the device in the Y direction is shown in FIG. 3 with detail 115 of the channel stop region given in FIG. 4. Regions and structures 102, through 112, 116, 117, and 118 in FIGS. 1 and 2 correspond directly to regions and structures 202, through 212, 216, 217, and 218 in FIGS. 5 and 6 that will be discussed in more detail later.

Background charge generation is best understood with reference to FIG. 4. When a bias applied to gate electrode 103 is low, holes 119 are trapped at the interface between semiconductor substrate 112 and gate dielectric 118. As the bias applied to gate electrode 103 is changed from low to high level, holes 119 that have been trapped at the interface are suddenly released and accelerated. The trapped holes have been uncovered due to the change in the depletion region boundary from location 113 to 114. As the accelerated holes gain energy they cause impact ionization and generation of electrons 120. Since almost all CCD devices have the topology shown in FIG. 1, where gate electrodes 102 and 103 overlap the channel stops 104 and 106, the generation of unwanted charge cannot be easily avoided. This is true for the structure shown in FIG. 1, representing only an example here, as well as for other more common CCD devices that have more than two gate electrodes and no VE regions 105. Devices that have VE regions and either multiple gate electrodes or a single gate electrode have an additional problem of background charge generation at the interfaces between the regions 102 and 105 and the regions 103 and 105.

In modern CCD devices, holes are usually attracted to the substrate-dielectric interface intentionally to lower the dark current generated during the image integration period. Since the hole trapping at the interface causes the background charge generation and corresponding noise it is difficult to see how to achieve an image intensifier operation according to prior art. It is also difficult to achieve an image intensifier operation without the background charge generation in the CCD devices that are very small and that are built using conventional layout techniques.

The prior art does not disclose a gate electrode structure in which is formed an aperture over which a charge multiplication electrode is disposed. The prior art does not disclose a method in which initially detected charge in storage well is multiplied by single-carrier impact ionization process instead of an avalanche process. The prior art does not disclose a method in which a significant multiplication gain, without background noise generation, is achieved using a repetitive charge transfer back and forth within a single cell or by using many cells connected together in a CCD fashion. The prior art does not disclose a method of achieving an externally programmable charge gain by controlling the number of multiplication transfers within one cell.

A Semiconductor Image Intensifier

The present inventor has discovered that the noise floor of the device described in Hynecek U.S. Pat. No. 5,337,340 can be improved by minimizing the coupling of the high electric fields in the carrier-multiplication area to the channel stop. The present application therefore discloses a variety of structures in which this coupling is reduced, and noise performance is therefore improved. In many embodiments the region of high electric field lies within the cell area, which is laterally delimited by the channel stops and transfer barriers, but does not overlie the channel stops anywhere. Preferably the high-field region lies entirely within a depleted semiconductor volume.

The present application discloses an improved solid-state carrier multiplication stage, and imaging chips incorporating this stage, which provide improved immunity to dark current noise. In various embodiments, the application discloses a practical charge multiplication pixel that can be operated without generation of background charge. These and other objects are achieved in a cell of sensors that includes a channel formed in a substrate, a gate structure insulatively disposed over and transverse to the channel having an aperture formed therein, and a charge multiplication gate electrode insulatively disposed over the aperture. In one embodiment, the gate electrode structure includes a first aperture gate electrode having the aperture formed therethrough. In another embodiment, the gate electrode structure includes first and second aperture gate electrodes having respective first and second reticulations therein so as to frame the aperture. Additional embodiments include three or more gate electrodes through which is formed the aperture.

In an alternative embodiment, a method of multiplying charge collected in a storage well includes forming a multiplication well under a charge multiplication gate and a potential barrier under the charge transfer gate, the potential barrier being lowered until initial charge stored in the storage well transfers over the barrier into the multiplication well. Transferred charge causes single carrier impact ionization resulting in multiplying originally transferred charge. The method further includes transferring multiplied charge from the multiplication well back into the storage well or transferring it into a storage well of an adjacent cell connected to it in a CCD fashion.

The disclosed innovations, in various embodiments, provide one or more of at least the following advantages:

the charge gain of photocells or photo-detector pixels of image sensors can be programmed or controlled by electronic signals applied externally to the chip. (This is because it is possible to control the charge multiplication by altering the voltage on the multiplication gate electrodes, or by controlling the number of pulses used in multiplication cycles.)

a practical high performance monolithic Solid State Image Intensifier (SSII) in any of various architectures.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 13 is a plan view of a unit cell and associated circuitry from an array of an Active Pixel CMOS Image Sensor that incorporates an IMPACTRON structure according to a sample embodiment;

DETAILED DESCRIPTION OF THE PREFERRED EMBODIMENTS

The numerous innovative teachings of the present application will be described with particular reference to the presently preferred embodiment (by way of example, and not of limitation).

Figure 5:
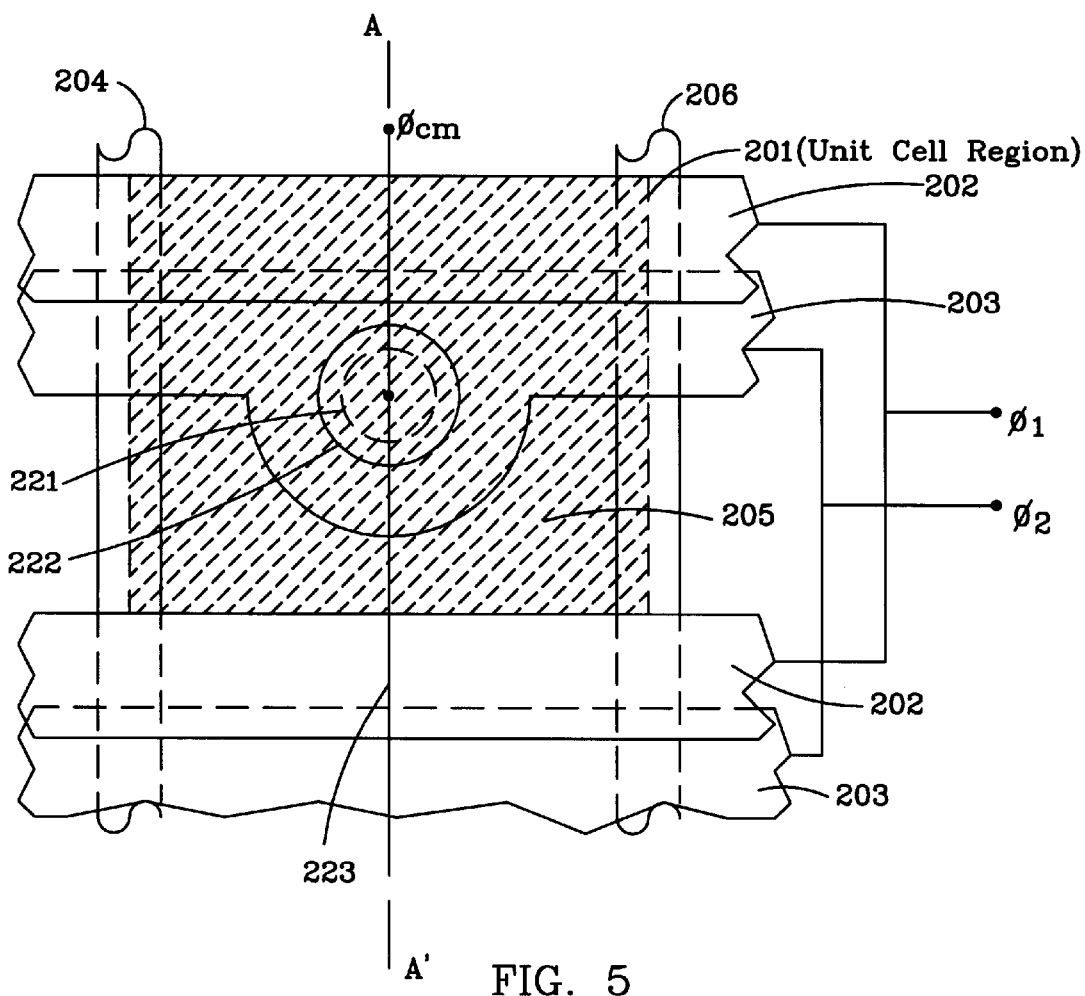
FIG. 5 is a plan view of a generic IMPACTRON unit cell according to the invention.
Figure 6:
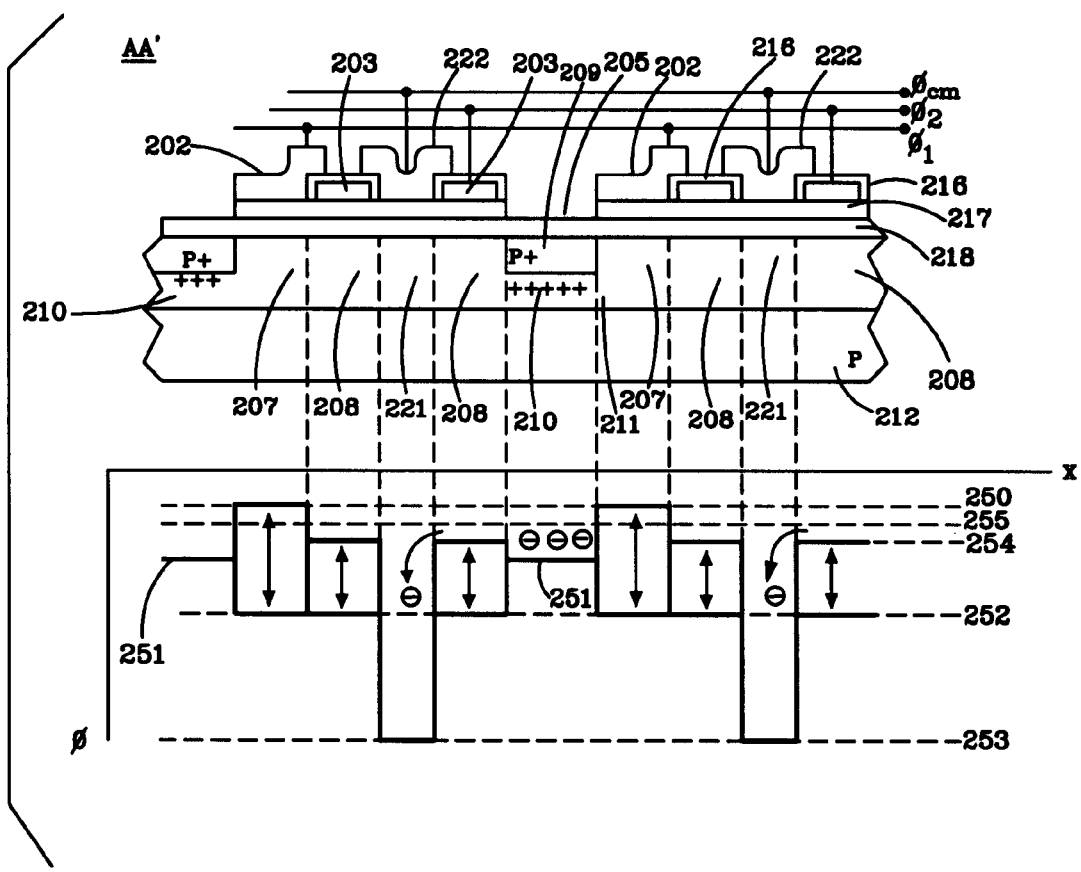
FIG. 6 is a cross section of the IMPACTRON cell shown in FIG. 5 with the corresponding potential profiles for several different gate biasing conditions.

In FIGS. 5 and 6, an IMPACTRON cell 201 is depicted in plan view with corresponding cross section along the line A–A'. In FIG. 5, channel stop regions 204 and 206 confine charge in the Y direction while gate electrodes 202 and 203 together with the Virtual Electrode (VE) region 205 confine charge in the X direction. The electrical interconnect lines to apply clock signals f1 and f2 to the physical structures are shown symbolically.

Figure 1:
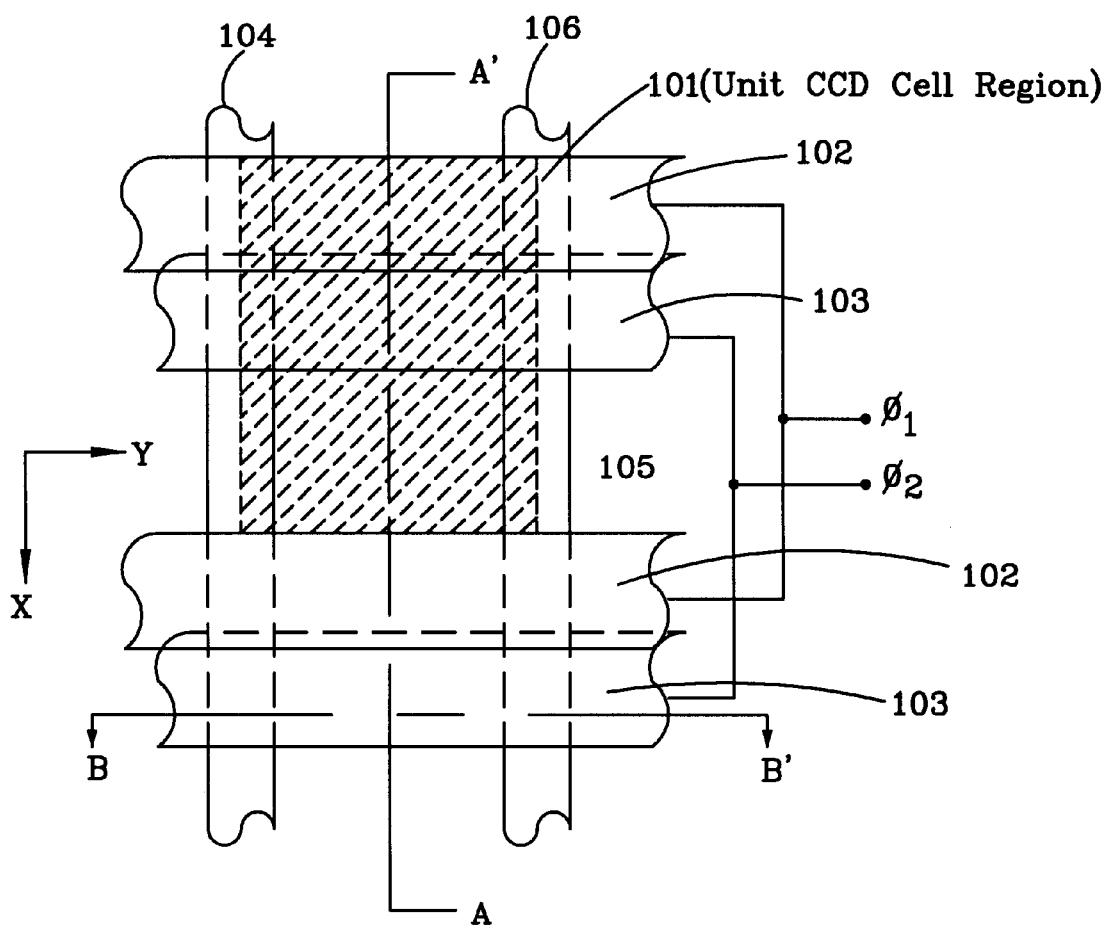
FIG. 1 is a plan view of a known CCD cell that is typically found in the prior art.
Figure 2:
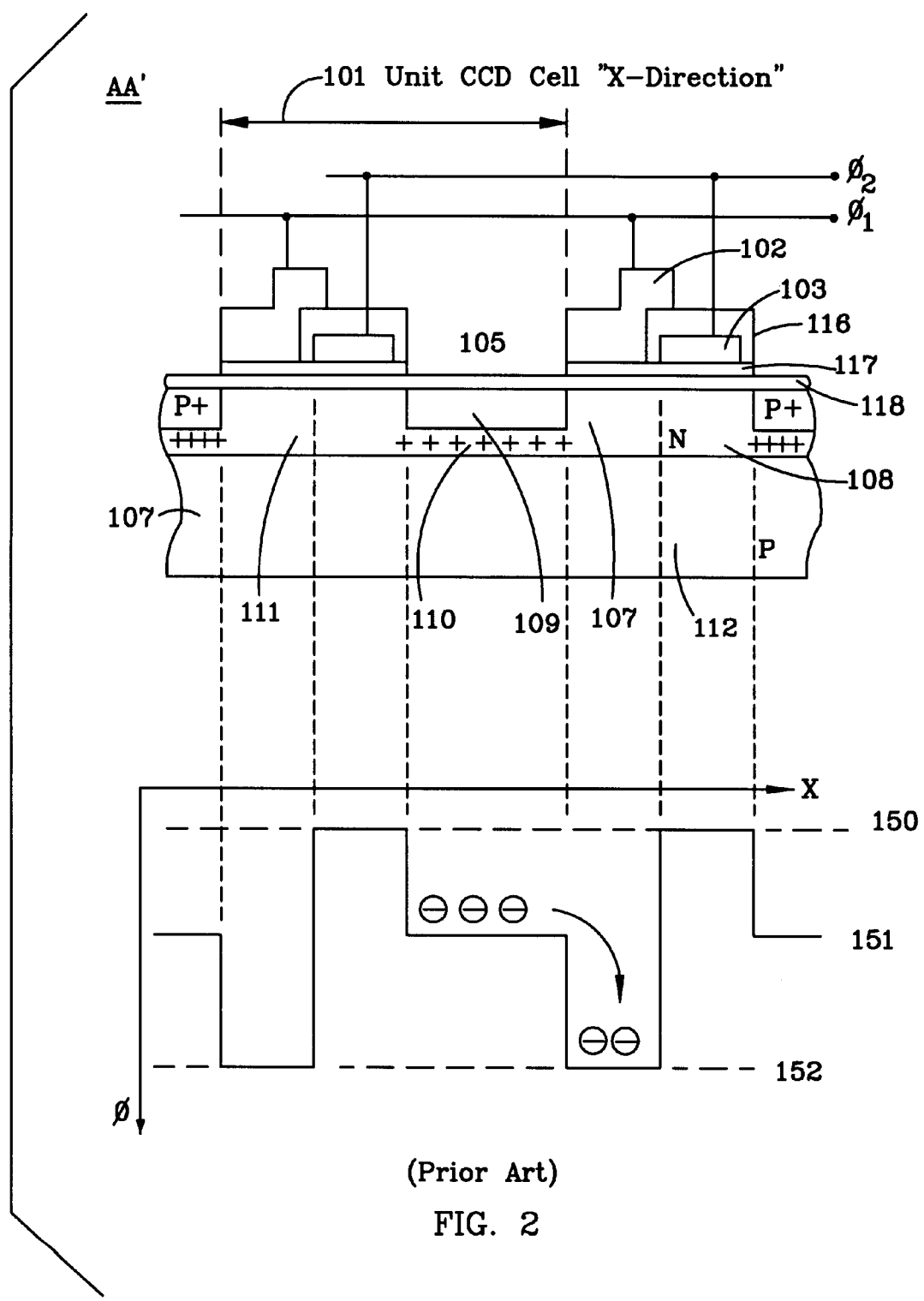
FIG. 2 is a cross section of the standard cell shown in FIG. 1 with potential profiles used for an explanation of the charge transfer process.
Figure 3:
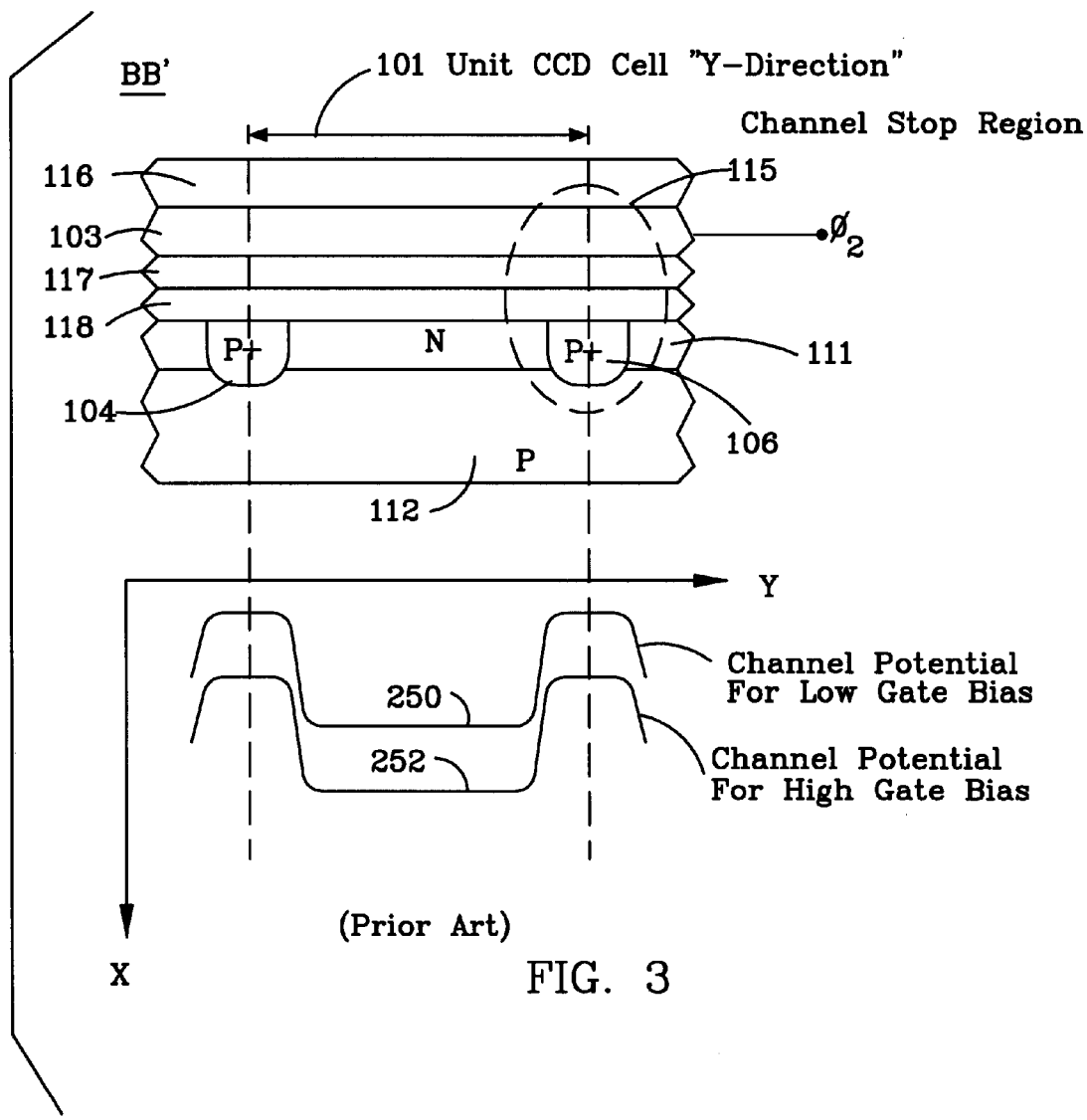
FIG. 3 is a cross section of the standard cell along the line B–B' of FIG. 1 including the potential profiles in that direction for two different gate-biasing conditions.
Figure 4:
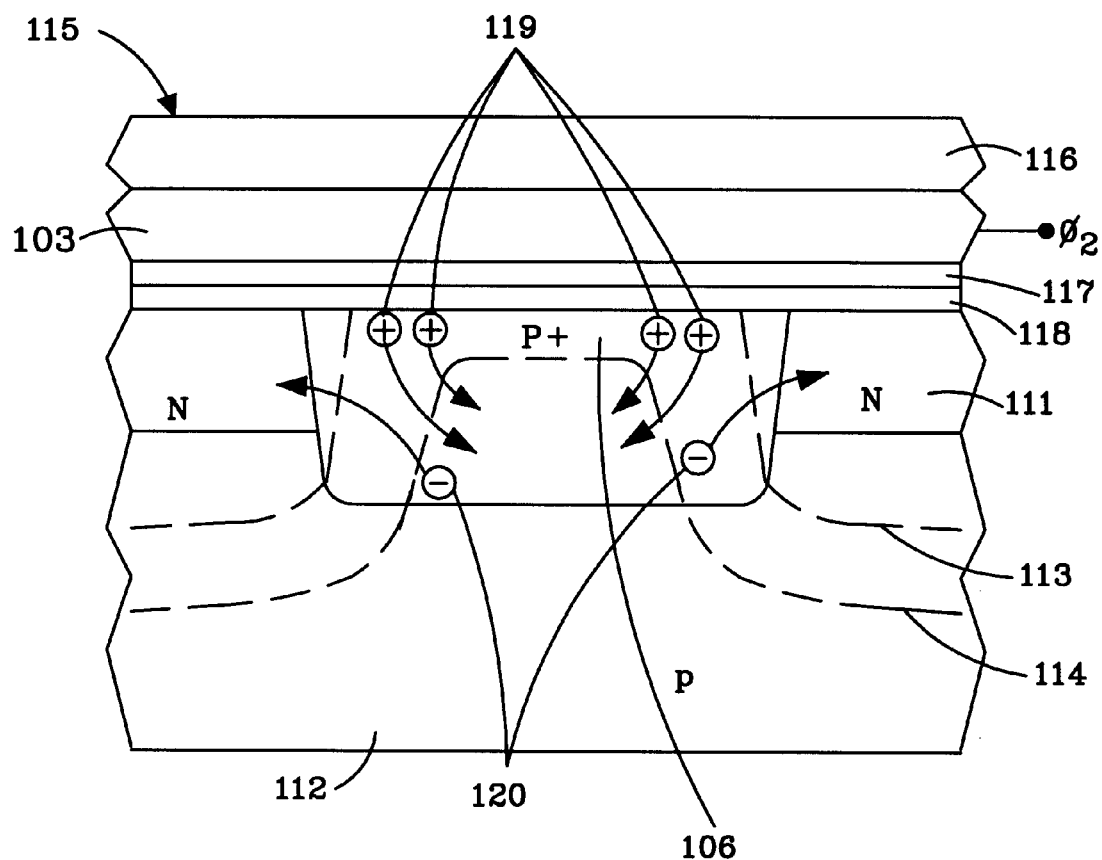
FIG. 4 is a detail cross section of a channel stop region and illustration of the origin of generation of background charge by the hole impact ionization process.

A feature of the structure of FIGS. 5 and 6 that is absent from the structure of FIGS. 1 and 2 is a circular aperture 221 opened in gate electrode 203 in an approximate center of the CCD channel. The same material used for the formation of gate electrode 202 covers the gate-opening region 221. However, the use of the same material is not necessary for the correct function of the device. The resulting gate 222, called a Charge Multiplication (CM) gate, is connected to metal line 223 and finally to the device terminal driven by charge multiplication clock signal $\phi_{CM}$, as shown symbolically in FIG. 5.

The cell is fabricated on standard semiconductor p-type substrate 212 that may be, for convenience, silicon with a starting doping level on the order of $10^{15}$ cm$^{-3}$. Suitable n-type impurity region 211 is formed near the surface of the substrate, that forms the CCD channel, either by diffusion or by ion implantation and anneals. These steps are common in the industry and will not be described here in any more detail. The impurity concentration of this region may be on the order of $10^{17}$ cm$^{-3}$ and the thickness of the layer may be on the order of 3000 Ångstroms.

A suitable dielectric layer 218 is either deposited or grown on the substrate. It could be, for example, silicon dioxide $SiO_2$ that is 300 Ångstroms thick. The cell preferably further includes another dielectric layer 217 that is deposited on the top of the layer 218. For example, depositing 300-Ångstrom thick silicon nitride $Si_3N_4$ may form such a layer. Layer 217 is typically used for fabrication convenience and compatibility with known processes. It is not necessary for the correct IMPACTRON cell function. Another thin dielectric layer on the order of 50 Ångstroms may also be formed on top of the layer 217 for the convenience of manufacturing, but this is not shown in the figure.

The IMPACTRON cell further includes the gate electrode structure formed by the regions 202, 203, and 222. The gate material for these layers may be a suitably doped polycrystalline silicon (poly silicon), 4000 and 1500 Ångstroms thick, for the gate electrodes 202 and 203 respectively. The gates 203 are separated from the gates 202 and 222 by a thin dielectric layer 216. The dielectric film can be much thicker on the top of the gate 203 then on its sides. The thicker dielectric layer on the top, on the order of 2500 Ångstroms, significantly reduces the parasitic capacitance between the gates 202 and 203, while the thickness of the dielectric on the sides of the structures 203 is important for controlling the field and the inter-electrode breakdown voltage. The cell illustrated in FIGS. 5 and 6 includes virtual electrode (VE) region 205 formed by p+type-doped region 209 and a suitable n-type-doped layer 210. After the cell shown in FIGS. 5 and 6 is fabricated several dielectric and patterned metal layers, not shown in the drawing, are added to it. These structures facilitate the necessary electrical interconnections, metal to metal isolation, and also the overall chip scratch protection. Such layers are commonly used in the industry but are not essential for the function of the cell and were thus omitted from the description.

The semicircular shape of the gate electrode 203 and circular opening 221 shown in FIG. 5 is important for the uniformity of the electric field between the gate electrodes 203 and 222. However, persons skilled in the art will appreciate that opening 221 may be formed to be elliptical, oval, or even in the shape of a polygon without loss of function. The control of the uniformity of the field and the separation of the high field region from the channel stops are the important advantages of the IMPACTRON cell design.

The operation of the IMPACTRON cell, without generation of background charge, can be explained with reference to the potential diagrams shown in FIG. 6 and the cell timing diagram shown in FIG. 7. The entire timing cycle of the cell is divided into three basic intervals: the integration time interval $\tau_i$, the charge multiplication time interval $\tau_{CM}$, and the charge transfer time interval $\tau_{TR}$. During the integration time all three gate electrodes 202, 203, and 222 are biased at their most negative level, corresponding to the potential level 250 shown in FIG. 6. This level is called a pinning level, since the surface potential under the gates is pinned to the substrate for this bias. During this interval the holes from p+channel stops 204 and 206 and p+VE regions 205 flow under the gates and fill the interface states. This stops the generation of excessive dark current. When the integration period is completed and one or several photo-electrons are collected in the integrating potential well located in VE region 205, the bias of the gate electrodes 203 and 222 is increased to a value that corresponds to potential level 255 shown in FIG. 6. This marks the beginning of the charge multiplication interval.

Figure 7:
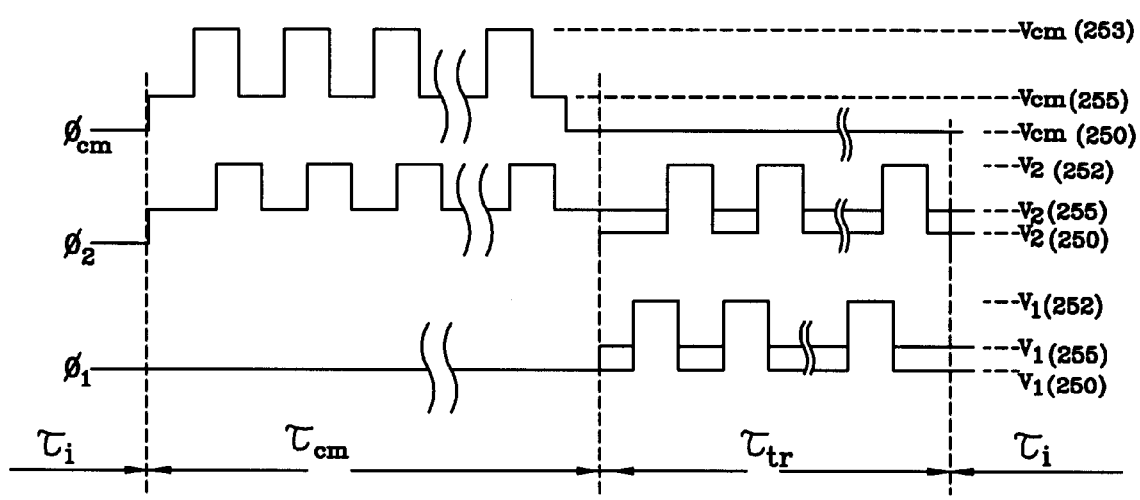
FIG. 7 is a generic timing diagram showing the three different cycles of the IMPACTRON cell timing.

In the charge multiplication interval $\tau_{CM}$, charge multiplication pulses are applied to gate electrodes 222 and 203 by respective clock signals $\phi_{CM}$ and $\phi_2$ as shown in FIG. 7. The charge multiplication pulses $\phi_{CM}$ and $\phi_2$ cause the potential under the respective gates in the regions 221 and 208 to vary between the levels 255 and 253. The phase relation of the pulses applied to the gate electrodes 222 and 203 is shown in detail in FIG. 7. The bias on both, charge multiplication gate electrode 222 and the gate electrode 203 are initially at a low level, corresponding to the potential level 255 (FIG. 6). Subsequently, the bias applied to the charge multiplication gate electrode 222 is raised to its highest level before the bias of gate electrode 203 is changed. In this state, the high positive potential of region 221 (under charge multiplication gate electrode 222) would attract photocharge from the integration well in region 209 if it were not for a potential barrier (low potential) formed in region 208 under gate electrode 203 (FIG. 6).

In the next step, after the bias on charge multiplication gate electrode 222 has been raised to its highest level, the bias on the gate electrode 203 is also raised to cause an increase in the potential of region 208. This lowers the potential barrier that existed between the region 221 (under the charge multiplication gate electrode 222) and the integration well in region 209. As a result, electrons begin to flow from the integration well in region 209 over the potential barrier in region 208 into the high field region formed between the high potential region 221 and the low potential region 208. The high field existing between the regions 221 and 208 induces transferring electrons to cause impact ionization and the generation of new electron-hole pairs.

After all of the electrons from the integration well in region 209 are transferred over the potential barrier in region 208 into the high potential region 221 and added with the electrons generated by impact ionization, the process is reversed so that all of the electrons in region 221 are transferred back to the integration well under VE electrode 205. This is accomplished by lowering the bias on charge multiplication gate electrode 222 before the bias on gate electrode 203 is lowered. In the next steps the process is repeated, and during each pulse cycle, the original charge quantity is multiplied. From the above description it is also clear that charge does not have to necessarily be transferred back to the original cell. It can be transferred in a serial CCD fashion to adjacent cells that form a suitably long charge multiplication chain. The number of pulses in the multiplication interval $\tau_{CM}$ can be very large. However, the most desirable number is between fifty and five thousand pulses.

The last timing interval is charge transfer interval $\tau_{TR}$, during which charge transfers out of the IMPACTRON cell and into the next structure adjacent to it. This can be another IMPACTRON cell or any other CCD structure such as a CCD register, CCD memory cell, or a charge detection node. During the charge transfer interval $\tau_{TR}$, pulses applied to the gates 202 and 203 cause the potential under the gates to swing between the levels 255 and 252 with the phase relationship shown in FIG. 7.

Due to the bias voltages being higher during the multiplication and readout intervals than during the integration time interval, the generation of background charge is eliminated. However, when the generation of background charge during the readout period is negligible, it is possible to simplify the timing generation circuitry and generate signals as shown by the dotted lines in FIG. 7. The gate electrodes 203 and 222 are clocked in this interval between the bias levels corresponding to potentials 252 and 250.

Since all of the gate electrodes are biased to the pinning bias only during the integration time interval, background charge is not generated in the IMPACTRON cell. This feature has the advantage of minimizing dark current generated at the substrate-dielectric interface. However, during the multiplication cycle time interval, all the holes are pushed away from the high-field regions under gate electrodes 203 and 222 and do not cause any impact ionization.

Figure 8:
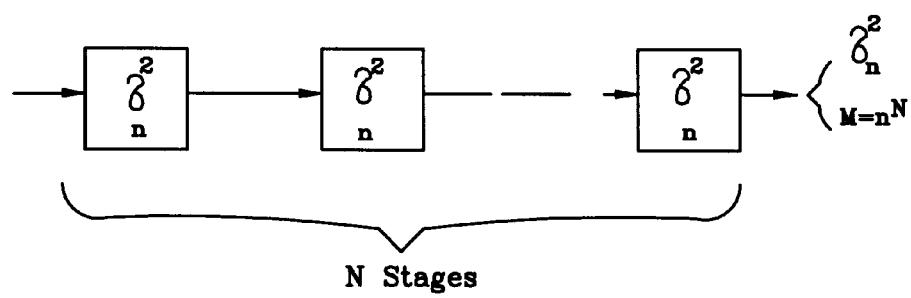
FIG. 8 is a block diagram depicting a model of the charge multiplication process used for the derivation of the charge multiplication noise formula according to the present invention.

Determination of noise generated in the IMPACTRON cell by charge carrier multiplication is an important factor in deciding whether the single photon detection (SPD) is possible. Since charge undergoes many transfers from cell to cell or within a one cell, accumulated noise can be very large. The charge multiplication process can be modeled as shown in FIG. 8. The model consists of a chain of N identical multiplication stages, each having a multiplication variance $\sigma^2$ and a multiplication mean n. Assuming that for the given number of stages N the multiplication factor $M=n^N$, it is possible to derive a formula for the excess noise factor F as shown below:

$$F^2 = 1 + \sigma^2 \frac{\left(1 - \frac{1}{M}\right)}{n(n-1)}$$

$$\approx 1 + \sigma^2 N \frac{\left(1 - \frac{1}{M}\right)}{\ln(M)}$$

The variance of each individual multiplication step is typically very small (on the order of $\sigma^2=0.002$), due to the monocrystalline nature of the semiconductor substrate. This is very fortunate since, according to the equation above, it is possible to increase the number of multiplication steps up to a several thousands before the excess noise factor $F^2$ significantly exceeds unity. Multiplication factors from ten to a hundred are thus possible even if the probability of multiplication in a single charge transfer step is very small. This is one of the features that separates the IMPACTRON single carrier charge multiplication concept from the standard avalanche multiplication. In image intensifier devices, based on the vacuum tube technology, the charge multiplication occurs in an amorphous material that covers micro-channel tube walls or dynode surfaces, and consequently the excess noise factor is typically $F^2=2$. The IMPACTRON has an advantage in excess noise performance in comparison to other image intensifier devices.

Another advantage of the IMPACTRON is in its flexibility of incorporation into many modern image sensor architectures. Several important examples of such incorporation are discussed herein with reference to FIGS. 9, 10, 11, and 12.

Figure 9:
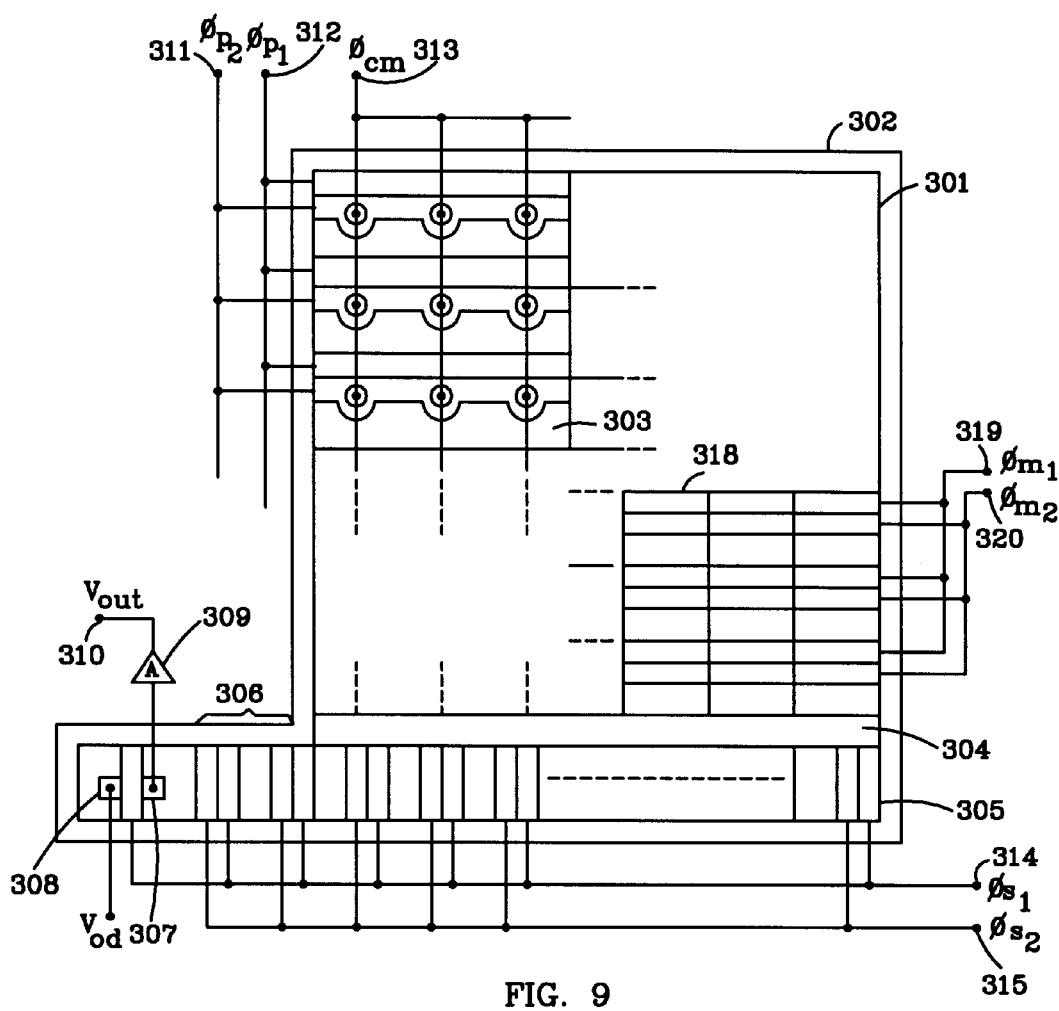
FIG. 9 is a layout diagram showing the layout of Full Frame and Frame Transfer CCD image sensors.

In FIG. 9, peripheral region 302, that has the same structure as channel stops 204 and 206 in FIG. 5, surrounds active area 301. The active area 301 is filled with array 303 of IMPACTRON cells 201 (FIG. 5). To supply proper bias voltages from external pulse drivers, the array is equipped with interconnect wires and terminals 311, 312, and 313. When the whole area 301 is filled with IMPACTRON cells, the resulting image sensor is called a Full Frame (FF) imager. This type of device can be used in imaging systems that have optical shutters, such as digital still cameras (DSCs), since it is necessary to stop the light from impinging on the device during the charge readout phase. The image sensing area 301 interfaces with the serial register 305 through an interface region 304. This can be another gate or simply just suitably shaped channel stop regions. After the image integration and multiplication of charge is completed, charge from the array is transferred, line by line, into the serial register. The serial register consists of standard CCD cells 101 as shown previously in FIG. 1. Several cells 306 have been added at the end of the register to span a distance from the array to detection node 307 and to amplifier 309. The charge detection node includes a region of n+ diffusion 307 that has been incorporated into standard cell 101. The amplifier input is connected to this n+ diffusion node. A reset gate and an output diode 308 terminate the serial register. The necessary clock bias voltages are supplied to the serial register by interconnect wires and terminals 314 and 315. By clocking the serial register, one line of the image signal is read out and output to the sensor output terminal 310. It is easy to see that after the serial register has been emptied of signal a new line of data can be input from the array. This is accomplished by applying appropriate clocking pulses to the parallel array terminals 311 and 312. The whole sensor is read out after all signal lines have been clocked out into the serial register and out to the detection node. After this cycle is completed the camera shutter can be opened and a new image signal integrated. The integration period is, of course, followed by the appropriate multiplication period before the readout period begins again.

An important variation of the Full Frame sensor readout technique is called the Time Delayed Integration (TDI) readout. In this readout mode the image projected on the image sensing area is not stationary; it moves. Charge is then clocked in the same direction and at the same average speed through the array to follow the moving image. Persons skilled in the art will appreciate that the IMPACTRON cell operation is compatible with this readout technique.

Full Frame image sensors of all types generate image Fixed Pattern Noise (FPN), more aptly called image Fixed Pattern Non-uniformity. The non-uniformity is caused by slight differences in device performance due to processing differences dispersed across the sensor. Full Frame image sensors with IMPACTRON cells incorporated in the active image sensing area 301 also suffer from image FPN. In fact, charge multiplication in IMPACTRON cells may amplify the image FPN. Therefore, in an alternate embodiment, an alternate serial register 317 (FIG. 10) replaces serial register 305 of FIG. 9. In serial register 317, a series of IMPACTRON cells is incorporated into the register just before charge detection node 307 and amplifier 309. The sensor is operated so that the clocking of IMPACTRON cells in image sensing area 301 limits the charge multiplication effects to provide only the desired margin of signal over the noise floor, and additional gain will be provided by the IMPACTRON cells in serial register 317. Since every packet of charge has to transfer through the same IMPACTRON cells of serial register 317, the transferred signals are always multiplied by the same amount. Thus, serial register 317 does not generate any image FPN.

The width of serial register 317 can be designed arbitrarily wider than in the registers in the image sensing area. In this way, the well capacity of the serial register is essentially unlimited, and the greatest well capacities are needed only in the latter stages of serial register 317. Typically, serial register 305 (FIG. 9) or serial register 317 (FIG. 10) are clocked at a high rate in order to rapidly transfer charge out through amplifier 309. In register 317, the IMPACTRON cells do not transfer charge back to the same cell after multiplication, charge is always transferred forward to the next cell to preserve the normal serial register clocking rate.

Another type of sensor is called a Frame Transfer (FT) image sensor. In this sensor the active area (e.g., area 301) is usually divided into two sections. A top section includes photo detectors and receives the image while a bottom section serves as a buffer memory. The bottom section is shielded from the impinging light. In a Frame Transfer sensor according to the present invention, IMPACTRON cells do not occupy the whole active area 301 of the sensor. According to the present invention, the top section (303 in FIG. 9) incorporates IMPACTRON cells, and the bottom section (318 in FIG. 9) incorporates only standard cells 101 (FIG. 1). The bottom section is usually called the image memory since it holds the image data during the readout process while a new image is integrated in the top section. Appropriate interconnecting wires connect the memory cells to the device terminals 319 and 320. The operation of the Frame Transfer image sensor is similar to the Full Frame device, however, the Frame Transfer sensor has an advantage in that the camera that incorporates it does not need a shutter. When the image charge is integrated and multiplied, it is quickly transferred to the image memory where it is shielded from impinging light. The charge transfer is very fast in order to minimize image smear that may result from the light impinging on the sensor while the charge transfer is in progress. The charge readout then proceeds from the image memory (i.e., bottom section) in the same fashion as charge readout would proceed in a Full Frame device.

It is possible to conceive of a Frame Transfer sensor that would have standard cells 101 in the image sensing area and IMPACTRON cells only in the image memory area. However, the charge multiplication would increase the smear and more dark current could be collected before multiplication. The same reasoning would apply for a device with the IMPACTRON in both the image memory and the image sensing areas.

Figure 10:
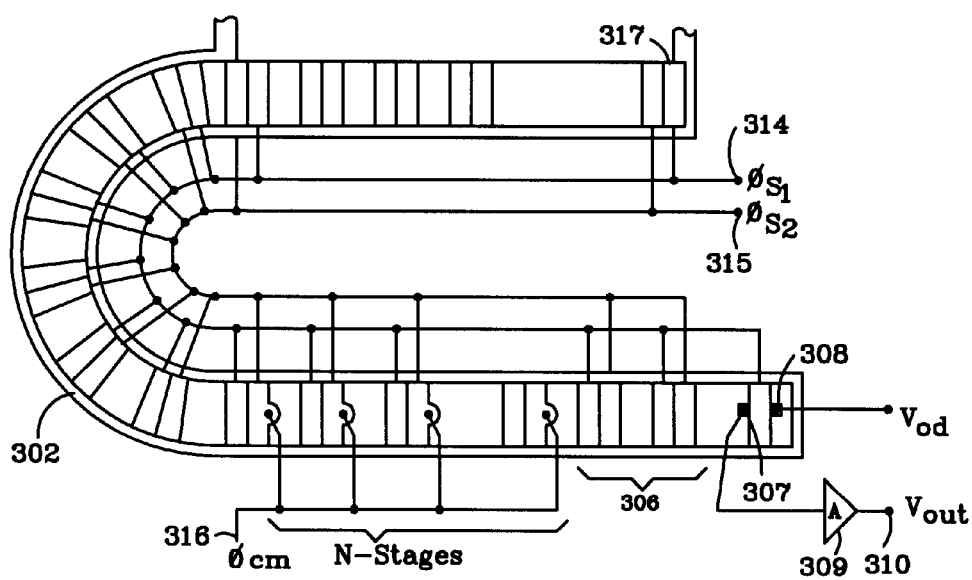
FIG. 10 is a plan view of an alternate serial register configuration according to the invention.

However, devices that have the IMPACTRON cells in the image sensing area and also in the serial register 317, as shown in FIG. 10, have an advantage. The image area well capacity is limited, and it is not possible to apply a very high gain to the signal in these pixels without a danger of saturating the well capacity. A moderate gain is still beneficial since the gain elevates the signal above the dark current noise floor. An additional full charge multiplication gain can then be applied in serial register 317 where the well capacity limit can be overcome by designing the serial register with sufficient width to have a desired well capacity.

One of the important benefits of charge multiplication can be obtained by incorporating IMPACTRON cells into an image sensor of the type disclosed in the U.S. Pat. No. 5,355,165 to Kosonocky. U.S. Pat. No. 5,355,165 to Kosonocky describes an image sensor that can take a limited sequence of pictures at a very high rate. In high-speed camera applications the amount of light available for exposing each frame is very small. Illuminating the observed scene with a very high light intensity usually circumvents the problem. However, in some cases, the high light intensity can interfere with the observed phenomenon or can even damage the observed object. At a minimum, the high light illumination requirement adds an additional undesired expense. For these application the high-speed camera is usually equipped with an image intensifier.

The high frame rate-sensing concept is based on the CCD sensor where each photo-sensing element incorporates a local CCD memory. The memory has the Serial-Parallel-Serial (SPS) design that is known in the industry. The sensor architecture with incorporated IMPACTRON cells can best be understood with reference to FIG. 11. The sensor area includes an array of the photocells 322, a three element horizontal register 325 coupled to each photocell 322, and a 3×3 IMPACTRON cell array 332 coupled to each horizontal register 325. Horizontal registers 325 include five standard CCD cells of a basic cell design such as 101 of FIG. 1. All active structures are separated by channel stop regions 321. Not all the wire interconnects are shown in the figure, only the connections 324 to the charge multiplication gate electrodes and the connections 330 and 331 to the serial output register. All CCD structures are shielded from light except for photocells 322, which are exposed; however, the light shield is not shown in the drawing for clarity. The first cell 323 of the each register 325 has the ability to receive charge from the photocell 322. The last cell of the register has a charge drain 326 incorporated in it.

Figure 11:
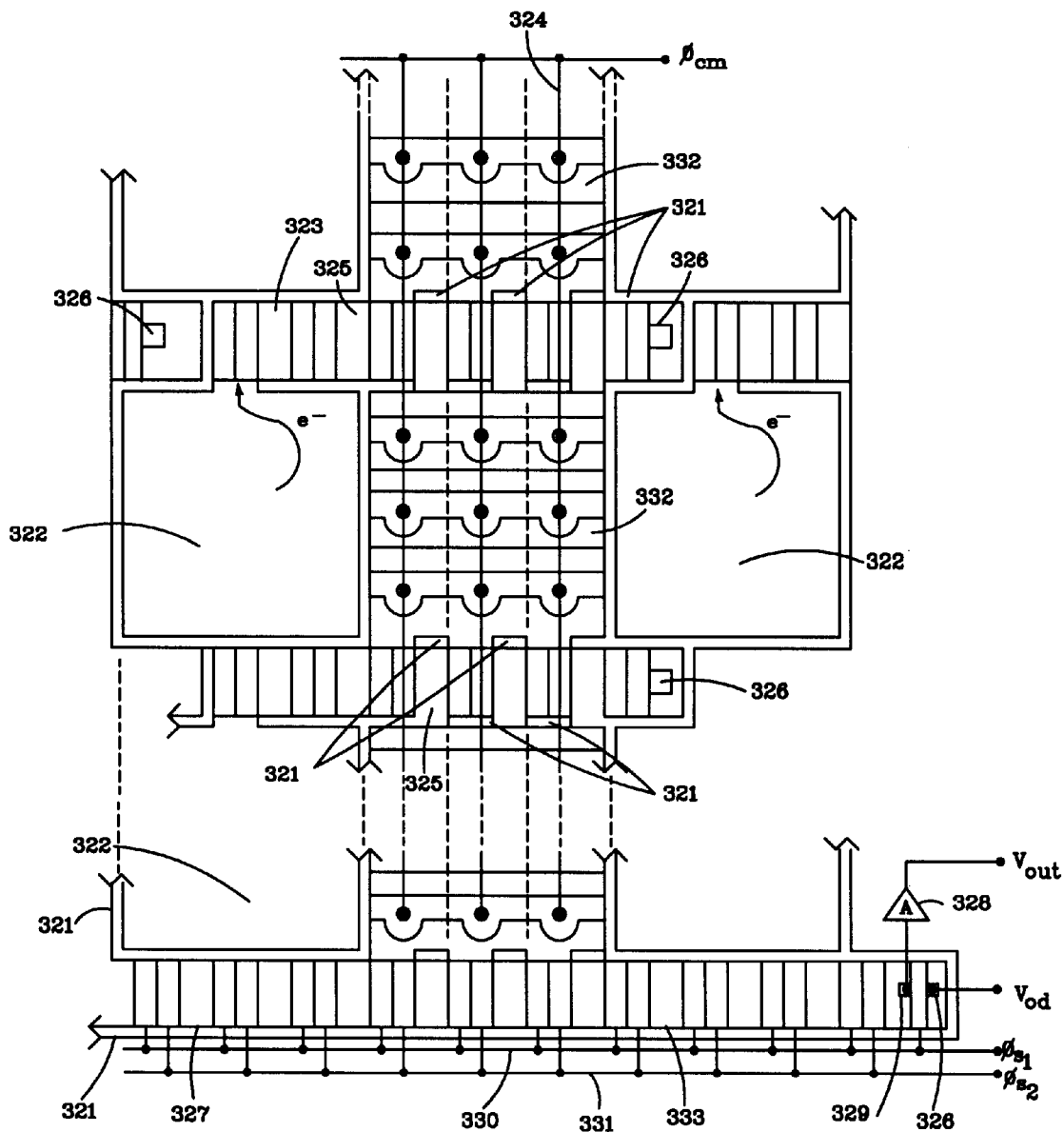
FIG. 11 is a layout diagram showing the layout of the high-speed CCD sensor that includes IMPACTRON cell structures.

In operation of the sensor of FIG. 11, charge from photocell 322 is regularly transferred into first register element 323 of horizontal register 325. Horizontal register 325 is regularly clocked to transfer charge packets from photodiode 322 down the register toward drain 326. After three successive charge packets have been shifted down horizontal register 325, IMPACTRON array 332 is clocked once. This action moves the three packets of signal charge into the first row of IMPACTRON array 332. This process is then repeated three times which completes the loading of IMPACTRON arrays 332. After the loading cycle is completed, charge stored in the IMPACTRON array is multiplied by operating the IMPACTRON cells according to the teachings herein. In this example, the sensor can store only nine consecutive image frames exposed at a very high frame rate. Exposure rates can be on the order of ten million frames per second. However, it is obvious to those skilled in the art that more frames can be stored if the SPS memory design is modified. For example, persons skilled in the art will appreciate how to modify the three element horizontal register 325 and the 3×3 IMPACTRON array 332 to achieve a sensor that can store 4, 16 or 25 consecutive image frames exposed at a very high frame rate.

The sensor readout operates very similar to the readout of the Full Frame architecture. IMPACTRON arrays 332 and horizontal serial registers 325 are clocked once to load the output serial register 333, located at the bottom of the sensor, with a valid data line. In the next step the output register is clocked continuously to transfer all the data into detection node 329 and from there into output amplifier 328. After all the data is read out from the register 333, IMPACTRON arrays 332 and the serial registers 325 are clocked again. This process is repeated until the whole image sensor is read out.

In the above description, the IMPACTRON structure is incorporated into the sensor array of U.S. Pat. No. 5,355,165 to improve the sensor performance. Many details of the design and operation have been omitted for brevity. U.S. Pat. No. 5,355,165 describes the high-speed readout sensor implemented in a different technology than described above. The example described above employs a technology that has two polysilicon gate electrode levels and a virtual electrode VE. Persons skilled in the art will appreciate the applicability of other similar technologies.

Another group of device architectures, called Interline Transfer (IT) architectures, involve cells that have photo-sensing regions separated from vertical charge transfer regions.

Figure 12:
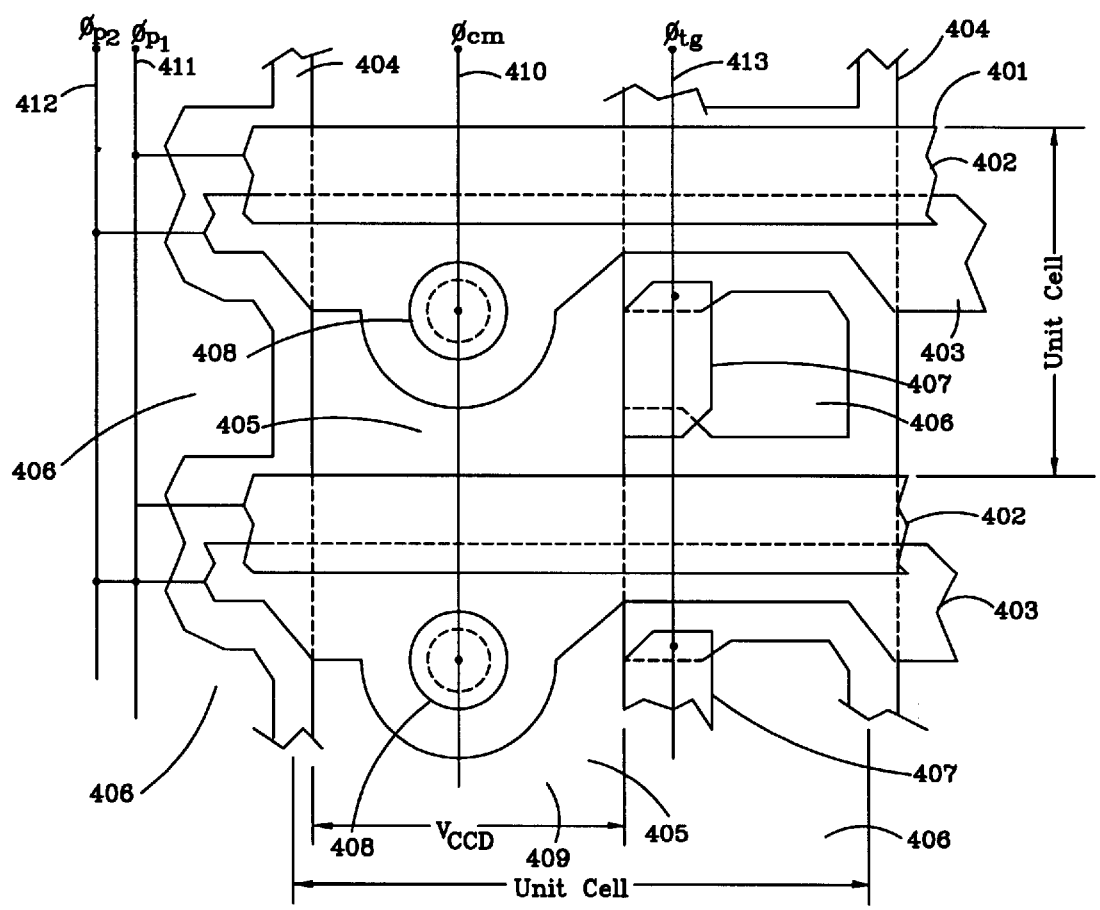
FIG. 12 is a plan view of an Interline Transfer Image CCD Sensor unit cell that incorporates an IMPACTRON structure according to the invention.

In FIG. 12, cell 401 is similar to the basic IMPACTRON cell shown in FIG. 5 at 201. However in cell 401, channel stop 404 of cell 401 may be regarded as much wider than channel stop 206 in cell 201. The additional width of channel stop 404 of cell 401 provides sufficient space to incorporate photo-sensing area 406 within the width of channel stop 404. The photo-sensing area can be a simple photodiode, a pinned photodiode, a schottky barrier photodiode, a phototransistor, or any other photo-sensing element known in the art. The details of such structures will not be described here. Charge accumulated in the photo-sensing area is transferred into vertical CCD channel 409 through transfer gate 407. Transfer gate 407 is connected to metal bus line 413 that supplies the necessary clock pulses $\phi_{TG}$. The cell is shielded from impinging light everywhere except over photo-sensing area 406. The light shield is formed from a suitable opaque layer deposited on top of the cell structure, but it is not shown in the drawing for clarity. The remaining cell structure, such as polysilicon gate electrodes 402, 403, 408, and the channel stop 404, correspond directly to the similar structures in cell 201. Metal bus lines 411 and 412 also serve the same purpose as in cell 401.

A 401 cell without the IMPACTRON structure would be called an Interline Transfer (IT) cell, and as such it is used in many modern CCD image sensors. However, a new improved Interline Transfer architecture results when the IMPACTRON cell 201, as in the Full Frame sensor shown in FIG. 9, replaces known vertical register elements of known Interline Transfer cells to provide IMPACTRON Interline Transfer cell 401 as described with reference to FIG. 12. The operation of such sensor is very similar to the operation of IMPACTRON cells in the Full Frame sensor, except that the image shutter in the optical camera system is now not needed. After the signal charge has accumulated in the photo-sites, charge is transferred to vertical registers 409 for readout. Since the vertical registers are shielded from the impinging light, no image smear is generated during the readout. Charge can be multiplied in the IMPACTRON cells of vertical register 409 before it is transferred into the serial readout register. The same considerations of incorporating the IMPACTRON cells into both, the vertical CCD registers and the horizontal readout register apply here as for the previously discussed Full Frame and Frame Transfer architectures. When the IMPACTRON Interline Transfer cells are incorporated in the Frame Transfer architecture by replacing cells 201, a new Frame Interline Transfer (FIT) architecture results.

Frame Interline Transfer architectures, without IMPACTRON cells, are well known to persons who are ordinarily skilled in the art and are not further discussed. Many other combinations of the IMPACTRON cell structure with sensor architectures are also possible, such as an imager with dual serial registers, serial registers located on both the top and the bottom of the array, etc. For example, when an image sensor array is constructed from only a one line of IMPACTRON Interline Transfer cells, a line sensor is created.

Another group of image sensors that benefit from the IMPACTRON structure, is the group that uses Active Pixel (AP) image detectors. These sensors are commonly known as CMOS sensors since they are usually fabricated by the CMOS processing technology. The main difference between the CCD and CMOS sensors, other than the manufacturing technology, is in image readout. In the CCD devices, charge is transferred from every pixel of the array into typically only one output detection node. This is accomplished by applying suitable clock voltages to various charge transfer gate electrodes of the array. In CMOS sensors, charge is sensed, buffered or amplified by a suitable amplifier directly in each pixel. The output of the pixel is then obtained by X-Y addressing the pixels and reading the amplified signal. There are some advantages that the CMOS sensors have in comparison to CCD devices. One example is in the system integration capability and another is in the low power consumption.

The incorporation of the IMPACTRON structure into an Active Pixel sensor is discussed with reference to FIG. 13. In FIG. 13, single pixel 525 of the array contains an active cell region 501 that incorporates a modified IMPACTRON cell. The cell includes gate electrode 502 and charge multiplication gate electrode 506. The area 505 is a virtual electrode region VE. The area of Active Pixel 525 that is outside of active region 501 is preferably formed as a channel stop. The IMPACTRON cell further includes the transfer gate electrode 503, n+ diffusion, charge detection node 508, reset gate electrode 504, and drain 509. The Active Pixel unit cell 525 further includes the sensing transistor 510 and the addressing transistor 511 shown here only symbolically.

In operation of the sensor of FIG. 13, photocharge is integrated in the storage well under the virtual electrode VE 505. After the integration is completed charge that has been integrated in the storage well under the VE region 505 is multiplied by applying the appropriate IMPACTRON clock voltages to the gate electrodes 502 and 506 as described previously. After the multiplication is completed, charge is transferred to the detection node 508, which is connected to the gate of the sensing transistor 510. Output node of the sensing transistor 510 is coupled through addressing transistor 511 to vertical sense line 514. When addressing transistor 511 is turned on, the output signal from the sensing transistor 510 is coupled through transistor 511 to vertical sense line 514 of the array. The line 514 is biased by the current source load 524 that terminates it. Many pixels of the array are typically connected to a single column sense line (e.g., column sense line 514). Vertical scanner circuit 521 consecutively turns on and off transistors 511 via lines 512 to facilitate vertical scanning. After the signal has been sensed and transistor 511 is again turned off, a pulse is applied to reset gate electrode 504 to reset sense node 508 to the potential of drain 509. During the reset operation, drain bias line 513 is momentarily lowered to a suitable reset voltage level. Thus, line 513 serves a dual purpose here. It supplies the drain bias to the transistor 510 during readout, and it also supplies a reference bias to drain 509 during the reset operation. Horizontal scanner 519 then accomplishes the horizontal scanning of the array. The scanner supplies the command pulses to the horizontal scanning switches 515 that consecutively connect vertical sense lines 514 to horizontal sense line 516. The array amplifier 517 buffers the signal appearing on horizontal sense line 516 and delivers a buffered signal to output array terminal 518. While many variations of the above described basic Active Pixel CMOS sensor can be found in the literature, it is understood that the above description is only an example. The present invention includes all of those variations that incorporate the IMPACTRON structure.

Figure 14:
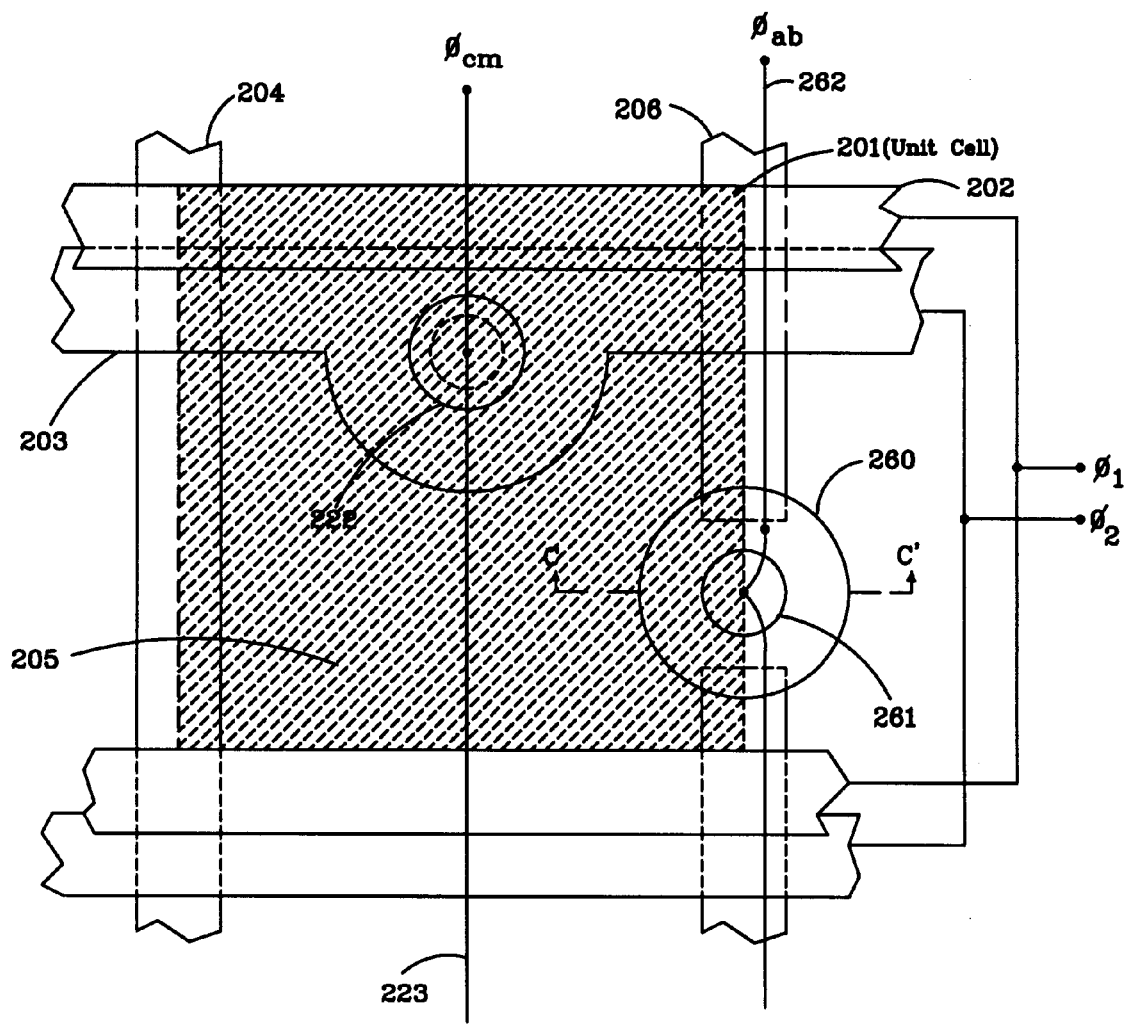
FIG. 14 is a plan view of a generic IMPACTRON unit cell structure that incorporates a Lateral Overflow Drain antiblooming structure.
Figure 15:
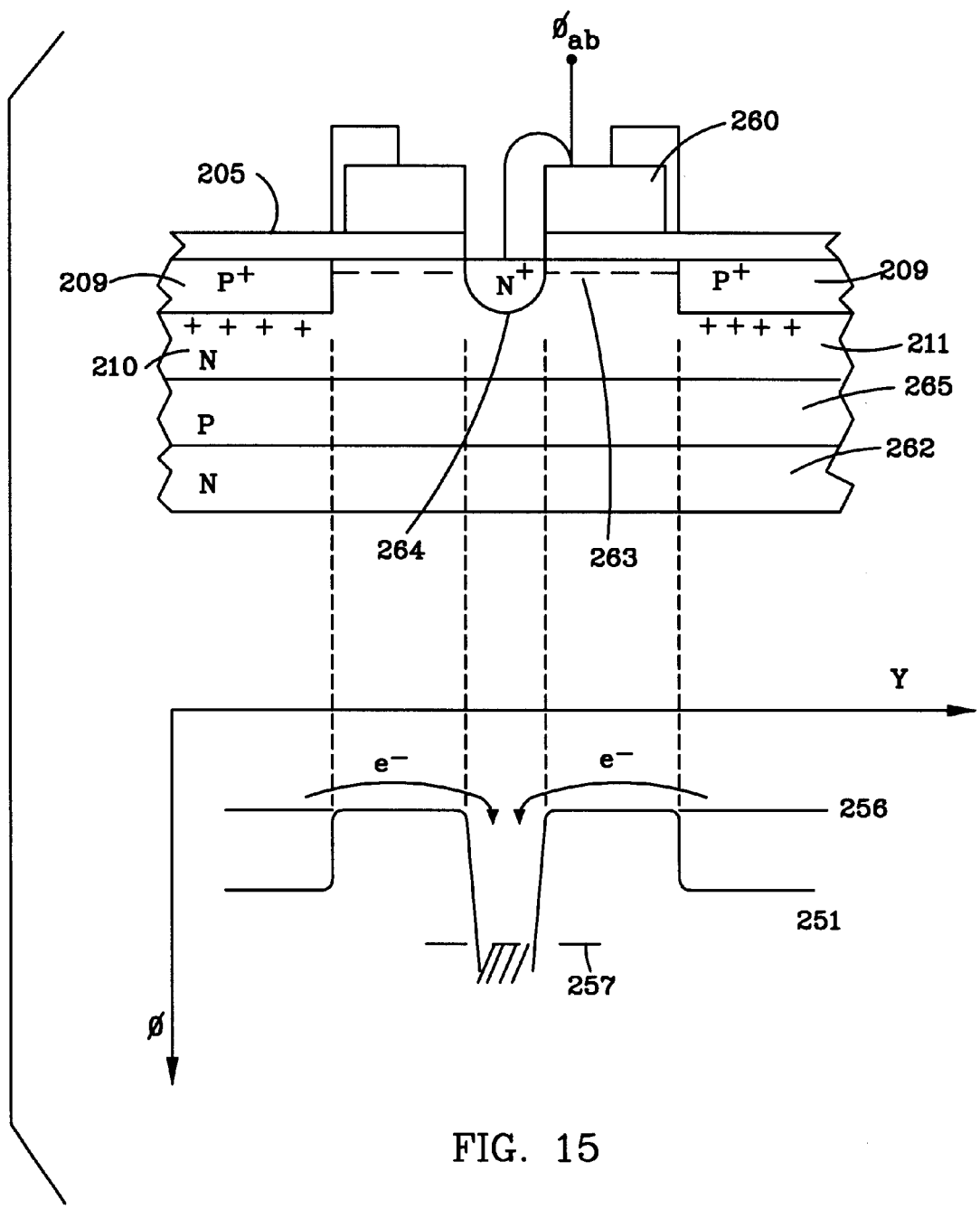
FIG. 15 is a cross section of the cell in FIG. 14 along section line C–C' that also includes a cell potential profile in that direction.

There are many details that have been omitted from the above descriptions for the sake of brevity. For example, the image sensors are typically equipped with suitable anti-blooming structures. One such structure, called the Lateral Overflow Drain (LOD), applicable to the technology described herein, is described in U.S. Pat. No. 5,453,632 to Hynecek et al., and is incorporated herein by reference. The Lateral Overflow Drain structure is preferably placed in one of the channel stop regions of the IMPACTRON cell as depicted in FIG. 14. In FIG. 14, cell 201 includes polysilicon gate electrode 260 disposed over channel stop region 206 and a suitable Boron barrier implant 263 that has been implanted under gate electrode 260. Gate electrode 260 includes a central opening 261 that defines an n+ drain region 264. The drain region 264 is connected to gate electrode 260 and from there to a Lateral Overflow Drain terminal 266 by metal wiring. The structure thus creates a potential profile along the line C–C' that is shown in FIG. 15.

In operation of the Lateral Overflow Drain, a suitable bias 257 (FIG. 15) applied to Lateral Overflow Drain terminal 266 creates a potential barrier 256 that limits charge accumulated in the storage well. When photocharge integrates in the storage well under the virtual electrode VE 205 (FIG. 14) to level 256, determined by the amount of Boron implant 263 and bias applied to drain 264, electrons start to flow into the drain. This prevents blooming in the device by drawing off photoelectrons in excess of the quantity needed to lower the well potential below level 256.

Another common type of the anti-blooming structure is the Vertical Overflow Drain (VOD). Details of known Vertical Overflow Drain structures are omitted for brevity. This structure is typically built on substrates 262 that are n-type, and the CCD devices are placed in a suitable p-well 265 as shown in FIG. 15. Such a structure can be used even if the Vertical Overflow Drain is not electrically operable, since this structure is beneficial for reduction of bulk generated dark current. Persons skilled in the art will appreciate that IMPACTRON cell 401 is compatible with Vertical Overflow Drain structures.

For currently fabricated samples (TC301), sample clocking voltages with respect to substrate (0V) are as follows:
Charge transport clocks: +2V and −4V;
Charge multiplication clocks: +18V and −4V (high level can be varied if different gain is required);
Pinning bias level: −5V.
However, those of ordinary skill will appreciate that these are merely exemplary, and can be adjusted for other device or process parameters.

Figure 16:
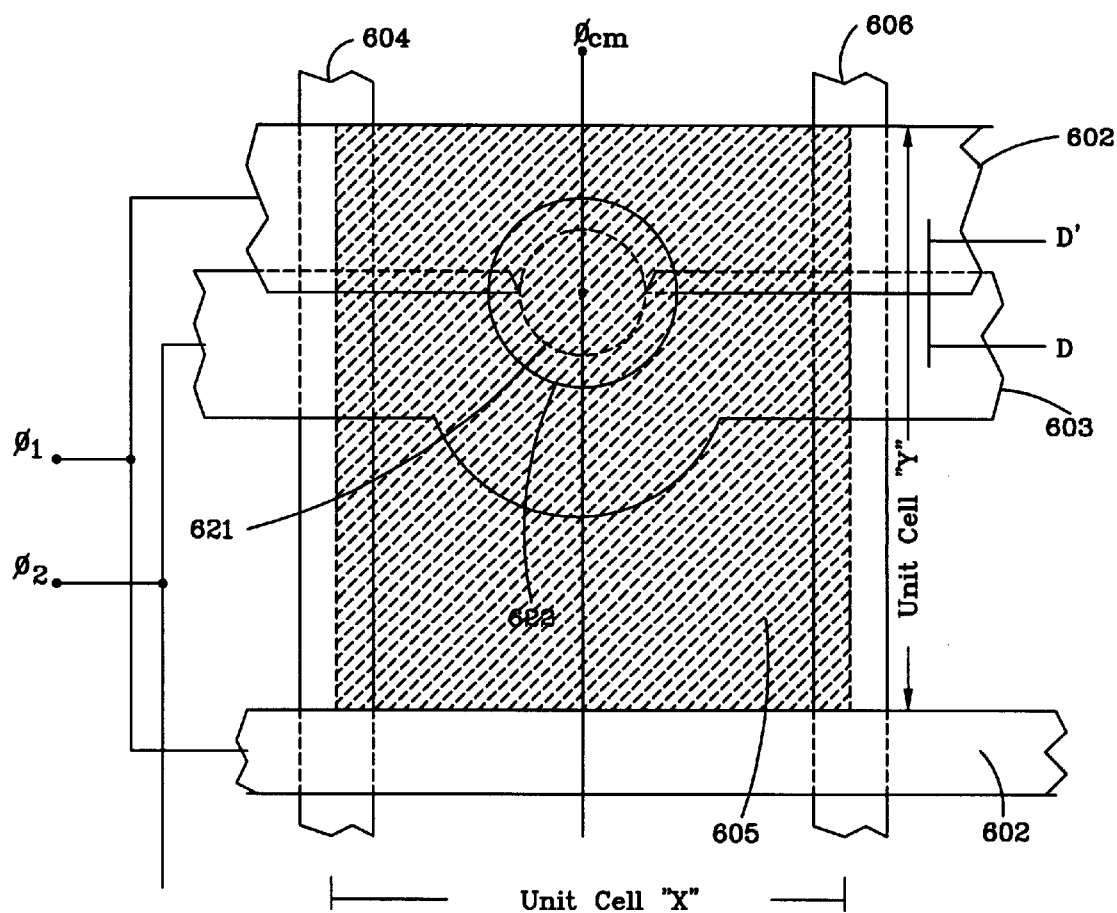
FIG. 16 is a plan view of an alternate IMPACTRON cell structure according to the invention.

In FIG. 16, an IMPACTRON cell includes a channel formed in a substrate defined between channel stops 604 and 606, charge multiplication gate electrode 622, and first and second gate electrodes 602 and 603 insulatively disposed over and transverse to the channel. First and second gate electrodes 602 and 603 have respective first and second reticulations so as to frame aperture 621 through the plan view of the first and second gate electrodes. Charge multiplication gate electrode 622 is insulatively disposed over the aperture. First and second gate electrodes 602 and 603 are formed out of respective first and second polysilicon layers, and charge multiplication gate electrode 622 is formed out of a third polysilicon layer. A section D–D' through first and second gate electrodes is depicted in FIG. 17.

Figure 17:
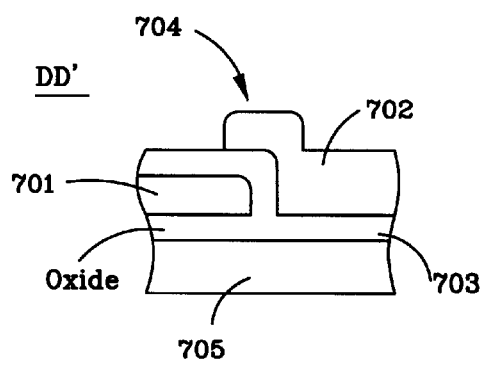
FIG. 17 is a cross section of the two-poly two-gate structure showing the gate overlap region in an IMPACTRON cell.

In FIG. 17, adjacent polysilicon gate electrodes are formed to create overlap 704 with insulator 703 disposed between them The structure is built on substrate 705. A first gate electrode 701 is formed out of the first polysilicon layer before the inter-electrode insulator is formed. In the next step the second gate electrode 702 is formed out of the second polysilicon layer. In the embodiment depicted in FIG. 16, additional insulator layer is formed over the second polysilicon layer and then charge multiplication gate electrode 622 is formed out of a third polysilicon layer over the structure that includes the first polysilicon layer, the inter-electrode insulation, the second polysilicon layer and another inter-electrode insulator.

Figure 18:
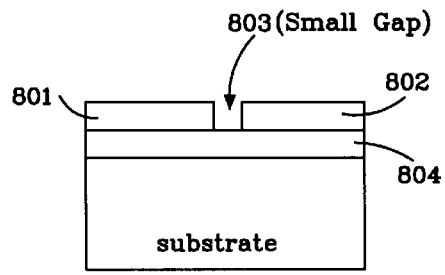
FIG. 18 is a cross section of an alternate planar single-poly multiple-gate structure in an IMPACTRON cell.

In FIG. 18, an alternative method for forming the IMPACTRON gate electrodes is depicted. In FIG. 18, gate electrodes 801 and 802 are formed adjacent with a small gap 803 between them insulated from substrate 805 by gate dielectric layer 804. This results in the gate electrode structure that is planar and also that is formed out of a single polysilicon deposition layer. Multiple gates can be formed in this way without processing complexities of depositing additional poly-silicon layers. With high-resolution lithography available today, the gaps can be controlled to be only 0.1 microns wide or less. This permits sufficiently strong electric fields to develop at the gate-to-gate interface regions and to facilitate both charge multiplication as well as an efficient charge transfer.

Figure 19:
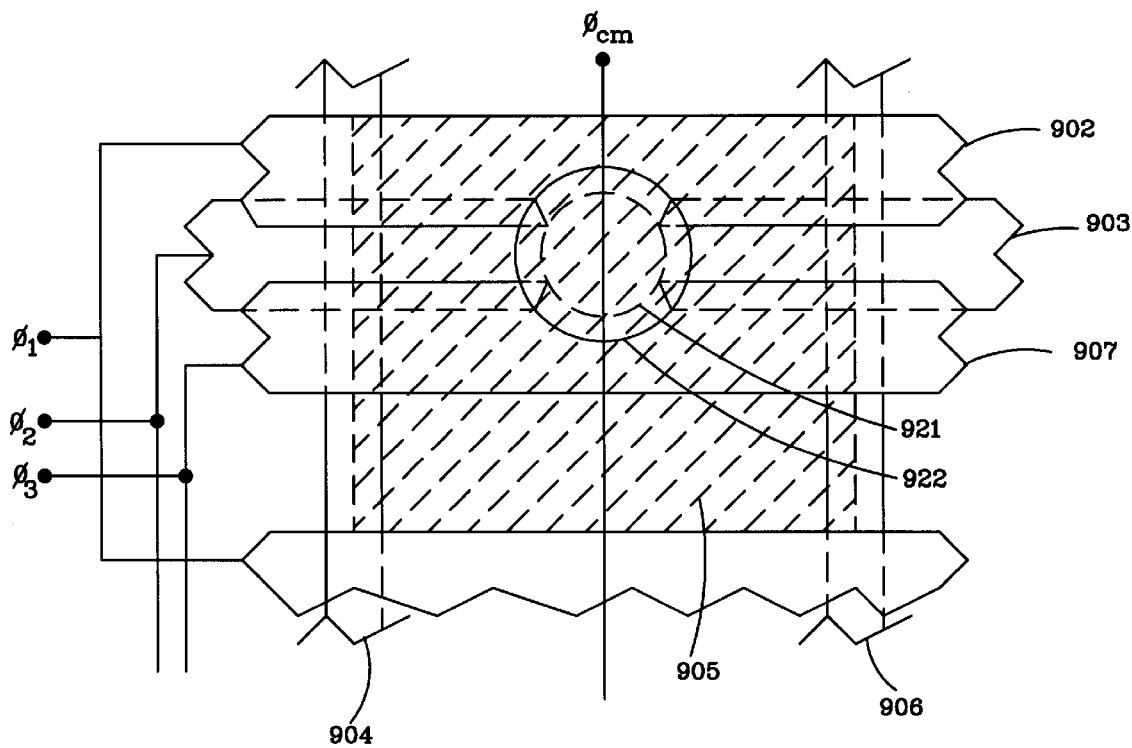
FIG. 19 is a plan view of yet another alternate IMPACTRON cell structure according to the invention.

In FIG. 19, an IMPACTRON cell structure includes a channel formed in a substrate defined between channel stops 904 and 906, charge multiplication gate electrode 922, and first, second and third gate electrodes 902, 903 and 907 insulatively disposed over and transverse to the channel. First and third gate electrodes 902 and 907 are formed out of the first polysilicon layer to have respective reticulations therethrough, and second gate electrode 903 formed out of the second polysilicon layer to have a gap therethrough in a vicinity of the reticulations in the first and third gate electrodes so as to form aperture 921 through the plan view of the first, second and third gate electrodes. Charge multiplication gate electrode 922 is formed out of a third polysilicon layer to be insulatively disposed over the aperture. Persons skilled in the art will appreciate that this IMPACTRON cell structure can be extended to include additional gate electrodes having gaps that contribute to aperture 921 under charge multiplication gate electrode 922. For example, gate electrode 903 may be split into two separate gate electrodes 903A and 903B so that the IMPACTRON cell structure of FIG. 19 would include four gate electrodes.

While the above description refers mostly to the p-type silicon substrates and $SiO_2$ dielectrics, it will be appreciated by persons skilled in the art that it is possible to use n-type substrates as well as other types of materials such as Gallium Arsenide, Mercury Cadmium Telluride, etc. Of particularly high interest is a silicon based IMPACTRON Interline Transfer device where the photo-site regions are Platinum Silicide Schottky barrier diodes.

It will be appreciated by persons skilled in the art that standard color filter arrays and micro-lens arrays are also compatible with the IMPACTRON technology and can be deposited or otherwise formed on the IMPACTRON image sensors. This flexibility is unique to the IMPACTRON structure, and it is not available in vacuum tube image intensifier devices. The IMPACTRON cell structure makes it possible to build efficient color single photon detection (SPD) image sensors, and in this way, significantly advance the art of the color low-light level imaging.

According to a disclosed class of innovative embodiments, there is provided: A solid-state image intensifier device, comprising: a photosensitive area; a channel stop which at least partly delimits said photosensitive area; and a high-field carrier-multiplication area which lies at least partly within said photosensitive area; wherein said carrier-multiplication area nowhere overlies said channel stop.

According to another disclosed class of innovative embodiments, there is provided: A solid-state photosensor device, comprising: a carrier-multiplication area, in which a high electric field can be applied to induce impact ionization; and a photocarrier collection area, comprising a semiconductor material of a first conductivity types; device structure which permits charge collected in said collection area to be multiplied in said multiplication area; wherein said carrier-multiplication area nowhere overlies said channel stop.

According to another disclosed class of innovative embodiments, there is provided: A solid-state charge-amplification device structure, comprising: a laterally confined charge-storage well; and a carrier multiplication region, at which high electric fields can be applied to induce impact ionization of carriers within said well; wherein said multiplication region lies entirely within the interior of said well.

According to another disclosed class of innovative embodiments, there is provided: A solid-state charge-amplification device structure, comprising: at least one electrode pair positioned to induce a high lateral electric field within a volume of depleted semiconductor material, when said electrode pair is biased; and additional device structure for transferring carriers along a path which permits single-event impact ionization, but not avalanching, within said high-field region.

According to another disclosed class of innovative embodiments, there is provided: A solid state charge amplification method, comprising the step of: transferring one or more mobile carriers, in a semiconductor material, through a region of high electric field; wherein said region of high electric field is intense enough to provide single-step impact ionization, to thereby generate additional electrons in proportion to the number of electrons being transferred; and wherein said region of high electric field lies entirely within a volume of said semiconductor material which is depleted.

According to another disclosed class of innovative embodiments, there is provided: A solid-state charge-amplification device structure, comprising: at least one electrode pair positioned to induce a high lateral electric field within a volume of depleted semiconductor material, when said electrode pair is mutually biased; wherein said electrode pair is positioned sufficiently close to said volume of depleted semiconductor material that, when said electrode pair is mutually biased with a high enough voltage to permit impact ionization in said semiconductor material, the region where the electric field is high enough to permit impact ionization is sufficiently small that the probability of avalanching is essentially zero.

According to another disclosed class of innovative embodiments, there is provided: A sensor that includes at least one cell, each cell comprising: a channel formed in a substrate; a gate electrode structure insulatively disposed over and transverse to the channel having an aperture formed therein; and a charge multiplication gate electrode insulatively disposed over and within the aperture.

According to another disclosed class of innovative embodiments, there is provided: A sensor comprising: a channel formed in a substrate; a charge multiplication gate electrode; and at least first, second and third gate electrodes insulatively disposed over and transverse to the channel, the first and third gate electrodes having respective reticulations therein, the second gate electrode having a gap therethrough in a vicinity of the reticulations in the first and third gate electrodes so as to frame and aperture, wherein the charge multiplication gate electrode is insulatively disposed over and within the aperture.

According to another disclosed class of innovative embodiments, there is provided: A method of multiplying charge in a storage well, comprising the steps of: including a multiplication well under a charge multiplication gate electrode; reducing a barrier exiting between the storage well and the multiplication well until initial charge stored in the storage well transfers over the barrier into the multiplication well to generate additional charge by impact ionization, the initial charge combined with the additional charge constituting multiplied charge; and transferring the multiplied charge from the multiplication well into the storage well.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the use of the disclosed carrier-multiplication architecture is not limited to the range of imaging device architectures described above, but can be applied to other architectures.

For another example, the disclosed carrier-multiplication architecture is not limited to image intensification, but provides a device architecture which can be used for charge amplification in other circuit contexts too, such as charge-domain signal processing or radiation detection.

Using this technique, it is possible to control the amplification by altering the voltage on the multiplication gate electrode, or by controlling the number of pulses used in the amplification cycle, both of which can be controlled externally to the sensor chip. This can be particularly useful in color imaging, where, in some contemplated embodiments, separate amplification factors can be applied to the three color channels.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A solid-state image intensifier device, comprising:
    a photosensitive area;
    a channel stop which at least partly delimits said photosensitive area; and
    a high-field carrier-multiplication area which lies at least partly within said photosensitive area;
    wherein said carrier-multiplication area nowhere overlies said channel stop.

2. The device of claim 1, wherein said carrier multiplication region is defined by a lateral gap between a pair of insulated electrodes.

3. The device of claim 1, wherein said carrier multiplication region is located entirely within a depleted semiconductor volume.

4. A solid-state photosensor device, comprising:
    a carrier-multiplication area, in which a high electric field can be applied to induce impact ionization; and
    a photocarrier collection area, comprising a semiconductor material of a first conductivity types;
    device structure which permits charge collected in said collection area to be multiplied in said multiplication area;
    wherein said carrier-multiplication area nowhere overlies said channel stop.

5. The device of claim 4, wherein said carrier multiplication region is defined by a lateral gap between a pair of insulated electrodes.

6. The device of claim 4, wherein said carrier multiplication region is located entirely within a depleted semiconductor volume.

7. A solid-state charge-amplification device structure, comprising:
    a laterally confined charge-storage well; and
    a carrier multiplication region, at which high electric fields can be applied to induce impact ionization of carriers within said well;
    wherein said multiplication region lies entirely within the interior of said well.

8. The device of claim 7, wherein said carrier multiplication region is defined by a lateral gap between a pair of insulated electrodes.

9. The device of claim 7, wherein said carrier multiplication region is located entirely within a depleted semiconductor volume.

10. A solid-state charge-amplification device structure, comprising:
    at least one electrode pair positioned to induce a high lateral electric field within a volume of depleted semiconductor material, when said electrode pair is biased; and
    additional device structure for transferring carriers along a path which permits single-event impact ionization, but not avalanching, within said high-field region.

11. A solid-state charge-amplification device structure, comprising:
    at least one electrode pair positioned to induce a high lateral electric field within a volume of depleted semiconductor material, when said electrode pair is mutually biased;
    wherein said electrode pair is positioned sufficiently close to said volume of depleted semiconductor material that, when said electrode pair is mutually biased with a high enough voltage to permit impact ionization in said semiconductor material, the region where the electric field is high enough to permit impact ionization is sufficiently small that the probability of avalanching is essentially zero.

12. A sensor that includes at least one cell, each cell comprising:
    a channel formed in a substrate;
    a gate electrode structure insulatively disposed over and transverse to the channel having an aperture formed therein; and
    a charge multiplication gate electrode insulatively disposed over and within the aperture.

13. The sensor of claim 12, wherein the gate electrode structure of each cell includes a first aperture gate electrode having the aperture formed therethrough.

14. The sensor of claim 12, wherein the gate electrode structure of each cell includes first and second aperture gate electrodes having respective first and second reticulations therein so as to frame the aperture.

15. The sensor of claim 12, wherein each said cell further comprises: a transfer gate; a light detector coupled to the channel through the transfer gate; and a light shield disposed over the channel and around the light detector so as to leave the light detector exposed to light.

16. The sensor of claim 12, wherein the light detector of each cell includes one of a pinned photodiode and a Schottky barrier diode.

17. The sensor of claim 12, wherein each cell further comprises an anti-blooming structure, the anti-blooming structure including one of a lateral overflow drain and a vertical overflow drain.

18. The sensor of claim 12, wherein each cell further comprises: a transfer gate; a light detector capable of integrating photo-charge, the light detector being coupled to the anti-blooming structure and coupled to the channel through the transfer gate.

19. The sensor of claim 12, wherein the at least one cell includes a plurality of cells; and the sensor is one of a full frame area image sensor that includes the plurality of cells and a frame transfer area image sensor that includes the plurality of cells.

20. The sensor of claim 12, wherein the at least one cell includes a plurality of cells; and the sensor is one of an interline transfer area image sensor that includes the plurality of cells and a frame interline transfer area image sensor that includes the plurality of cells.

21. The sensor of claim 12, wherein the at least one cell includes a plurality of cells; and the sensor is one of a time delay integration sensor that includes the plurality of cells and a line array sensor that includes the plurality of cells.

22. The sensor of claim 12, wherein the at least one cell includes a plurality of cells; and the sensor is an active pixel CMOS sensor that includes the plurality of cells.

23. The sensor of claim 12, wherein the at least one cell that includes an array of cells; and the sensor further includes a light detector and a CCD register coupled between the array of cells and the light detector.

24. The sensor of claim 12, wherein the array of cells is organized in M columns by N cells; the CCD register further includes a plurality of register elements; the light detector is coupled to the CCD register to transfer charge from the light detector to each register element of the CCD register in a time sequence; the CCD register is coupled to the array of cells to parallel transfer a row of charge packets from M of the register elements of the CCD register to a first cell in each of the M columns of the array of cells.

25. The sensor of claim 12, wherein the at least one cell includes a plurality of cells; and the sensor further includes one of a color filter matrix, a striped pattern filter, and an array of micro-lenses disposed over the plurality of cells.

26. The sensor of claim 12, wherein said sensor includes a serial readout register; and each cell is an element of the serial readout register.

27. The sensor of claim 12, wherein the gate structure of each cell includes a first aperture gate electrode and one of: the first aperture gate electrode has the aperture formed therethrough; and the gate electrode structure of each cell further includes a second aperture gate electrode, the first and second aperture gate electrodes having respective first and second reticulations therein so as to frame the aperture.

28. The sensor of claim 12, further comprising a charge multiplication terminal coupled to the charge multiplication gate electrode to which is applied a charge multiplication signal; and a clock signal terminal coupled to the first aperture gate electrode to which is applied a clock signal, the clock signal and the charge multiplication signal cooperate to cause charge multiplication by impact ionization.

29. The sensor of claim 12, wherein the clock signal and the charge multiplication signal are timed to cause charge multiplication by impact ionization when the charge multiplication signal is stabilized at a maximum positive bias for the charge multiplication signal and the clock signal is transitioning from a maximum negative bias to a maximum positive bias for the clock signal.

30. The sensor of claim 12, wherein said clock signal and the charge multiplication signal are timed to define a first state when the clock signal is stabilized at its most negative bias and when the charge multiplication signal is stabilized at its most positive bias; and the clock signal and the charge multiplication signal are timed to transition from the first state to a second state when the clock signal transitions from its most negative bias to its most positive bias and when the charge multiplication signal remains at its most positive bias, the transition from the first to the second state causing charge multiplication by impact ionization.

31. A sensor comprising:
   a channel formed in a substrate;
   a charge multiplication gate electrode; and
   at least first, second and third gate electrodes insulatively disposed over and transverse to the channel, the first and third gate electrodes having respective reticulations therein, the second gate electrode having a gap therethrough in a vicinity of the reticulations in the first and third gate electrodes so as to frame and aperture,
   wherein the charge multiplication gate electrode is insulatively disposed over and within the aperture.

32. The photosensor device according to claim 4, wherein the number of charge multiplication cells through which charge is sequentially transferred and multiplied is at least 50 and does not exceed 5000.

33. The photosensor device according to claim 12, wherein the number of charge multiplication cells through which charge is sequentially transferred and multiplied is at least 50 and does not exceed 5000.

34. The photosensor device according to claim 26, wherein the number of charge multiplication cells through which charge is sequentially transferred and multiplied is at least 50 and does not exceed 5000.

\* \* \* \* \*